United States Patent
Naito et al.

(10) Patent No.: US 9,768,117 B1
(45) Date of Patent: Sep. 19, 2017

(54) SEMICONDUCTOR DEVICE AND METHOD FOR MANUFACTURING SEMICONDUCTOR DEVICE

(71) Applicant: Toshiba Memory Corporation, Minato-ku (JP)

(72) Inventors: Shinya Naito, Toyota (JP); Takayuki Kakegawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/210,313

(22) Filed: Jul. 14, 2016

Related U.S. Application Data

(60) Provisional application No. 62/308,576, filed on Mar. 15, 2016.

(51) Int. Cl.
| | |
|---|---|
| *H01L 23/528* | (2006.01) |
| *H01L 27/1157* | (2017.01) |
| *H01L 27/11582* | (2017.01) |
| *H01L 27/11524* | (2017.01) |
| *H01L 27/11556* | (2017.01) |
| *H01L 23/522* | (2006.01) |
| *H01L 23/532* | (2006.01) |
| *H01L 21/768* | (2006.01) |

(52) U.S. Cl.
CPC .... *H01L 23/5283* (2013.01); *H01L 21/76816* (2013.01); *H01L 21/76877* (2013.01); *H01L 23/5226* (2013.01); *H01L 23/5329* (2013.01); *H01L 23/53257* (2013.01); *H01L 27/1157* (2013.01); *H01L 27/11524* (2013.01); *H01L 27/11556* (2013.01); *H01L 27/11582* (2013.01)

(58) Field of Classification Search
CPC ........... H01L 23/5226; H01L 21/76877; H01L 21/76816
USPC ....................................................... 257/314
See application file for complete search history.

(56) References Cited

U.S. PATENT DOCUMENTS

| | | | |
|---|---|---|---|
| 8,294,199 B2 | 10/2012 | Yahashi et al. | |
| 9,659,955 B1* | 5/2017 | Sharangpani | ..... H01L 27/11582 |
| 9,659,957 B2* | 5/2017 | Aoyama | ........... H01L 27/11582 |
| 2011/0175155 A1 | 7/2011 | Yaegashi | |
| 2014/0070302 A1 | 3/2014 | Yoo et al. | |
| 2015/0311214 A1 | 10/2015 | Yoo et al. | |

FOREIGN PATENT DOCUMENTS

| | | |
|---|---|---|
| JP | 2011-151072 | 8/2011 |
| JP | 2012-28537 | 2/2012 |
| JP | 2014-57067 | 3/2014 |

* cited by examiner

*Primary Examiner* — Theresa T Doan
(74) *Attorney, Agent, or Firm* — Oblon, McClelland, Maier & Neustadt, L.L.P.

(57) ABSTRACT

According to one embodiment, a substrate includes a first portion and a second portion. The first portion has a columnar configuration. The second portion has an upper surface continuous with a side surface of the first portion via a corner. A plurality of electrode layers include a lowermost electrode layer opposing the side surface of the first portion above the second portion. An insulating film is provided between the side surface of the first portion and a side surface of the lowermost electrode layer, and between the upper surface of the second portion and a lower surface of the lowermost electrode layer. An angle formed between the upper surface of the second portion and the corner of the substrate on the insulating film side is greater than 90°.

15 Claims, 33 Drawing Sheets

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from U.S. Provisional Patent Application 62/308,576, filed on Mar. 15, 2016; the entire contents of which are incorporated herein by reference.

FIELD

Embodiments described herein relate generally to a semiconductor device and a method for manufacturing a semiconductor device.

BACKGROUND

A three-dimensional memory device that includes a plurality of electrode layers stacked on a substrate, and a semiconductor body piercing the electrode layers in the stacking direction of the electrode layers to reach the substrate has been proposed. A lowermost electrode layer most proximal to the substrate of the electrode layers induces a channel (an inversion layer) in the front surface of the substrate.

DETAILED DESCRIPTION

Figure 1:
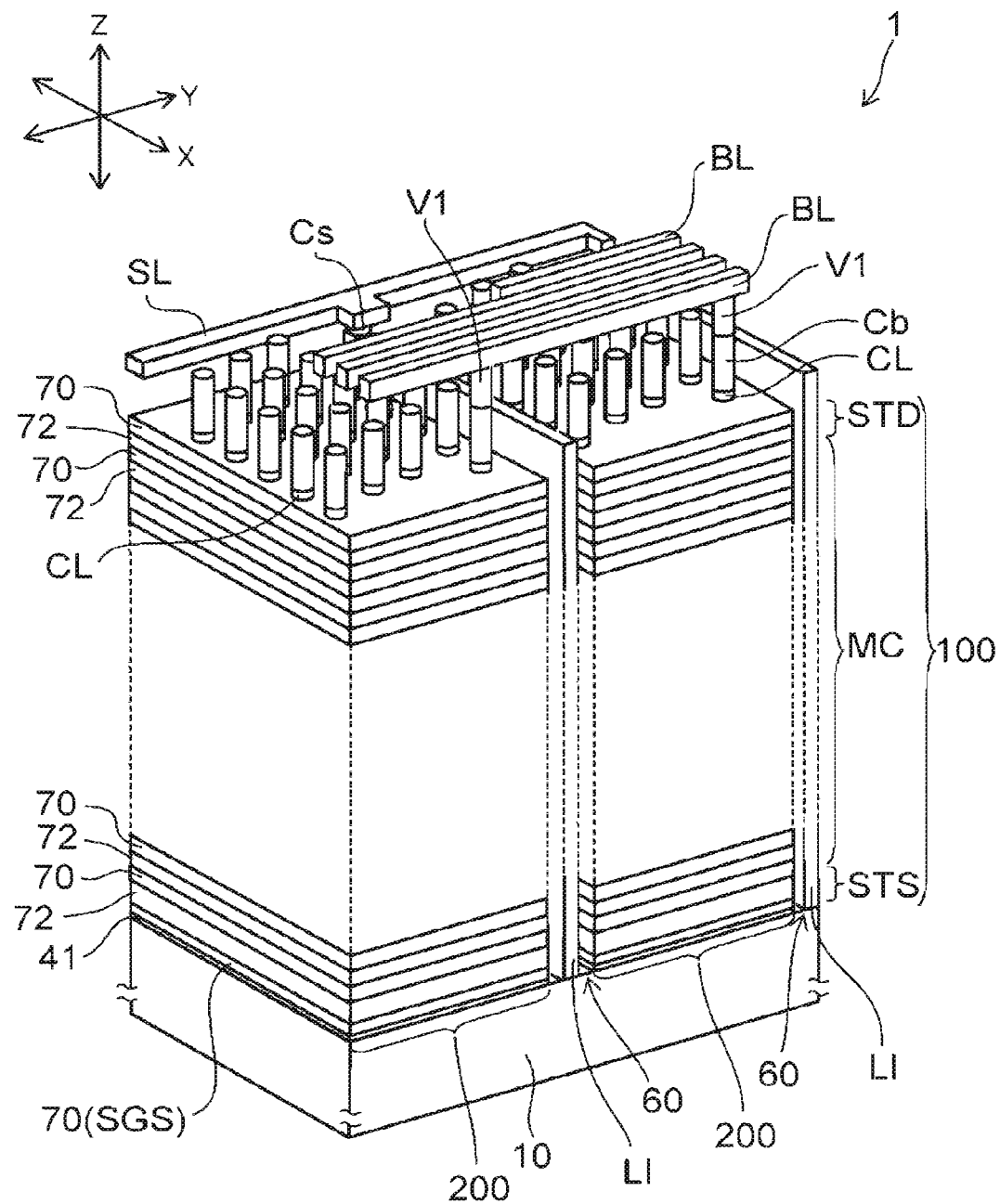
FIG. 1 is a schematic perspective view of a semiconductor device of an embodiment.

According to one embodiment, a semiconductor device includes a substrate, a stacked body, an insulating film, a semiconductor body, and a charge storage portion. The substrate includes a first portion and a second portion. The first portion has a columnar configuration. The second portion has an upper surface continuous with a side surface of the first portion via a corner. The stacked body is provided above the substrate. The stacked body includes a plurality of electrode layers stacked with an insulator interposed. The electrode layers include a lowermost electrode layer opposing the side surface of the first portion above the second portion of the substrate. The insulating film is provided between the side surface of the first portion of the substrate and a side surface of the lowermost electrode layer, and between the upper surface of the second portion of the substrate and a lower surface of the lowermost electrode layer. The semiconductor body extends in a stacking direction through the stacked body and contacts the first portion of the substrate. The charge storage portion is provided between the semiconductor body and the electrode layers upper than the lowermost electrode layer. An angle formed between the upper surface of the second portion of the substrate and the corner of the substrate on the insulating film side is greater than 90°.

Embodiments will now be described with reference to the drawings. The same components are marked with the same reference numerals in the drawings.

For example, a semiconductor memory device that includes a memory cell array having a three-dimensional structure is described as a semiconductor device in the embodiment.

FIG. 1 is a schematic perspective view of the memory cell array 1 of the embodiment.

Figure 2:
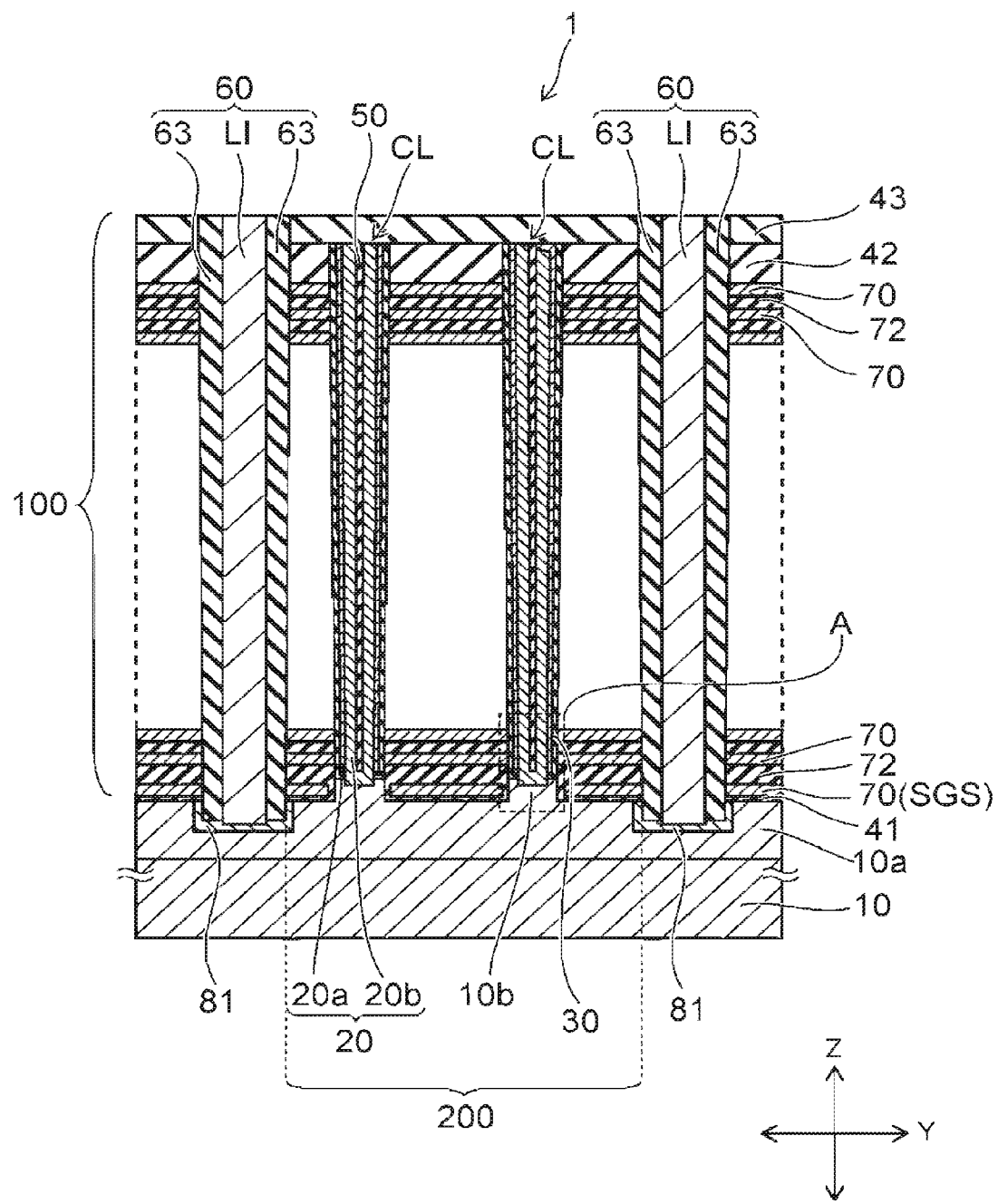
FIG. 2 is a schematic cross-sectional view of the semiconductor device of the embodiment.

FIG. 2 is a schematic cross-sectional view of the memory cell array 1.

Figure 3:
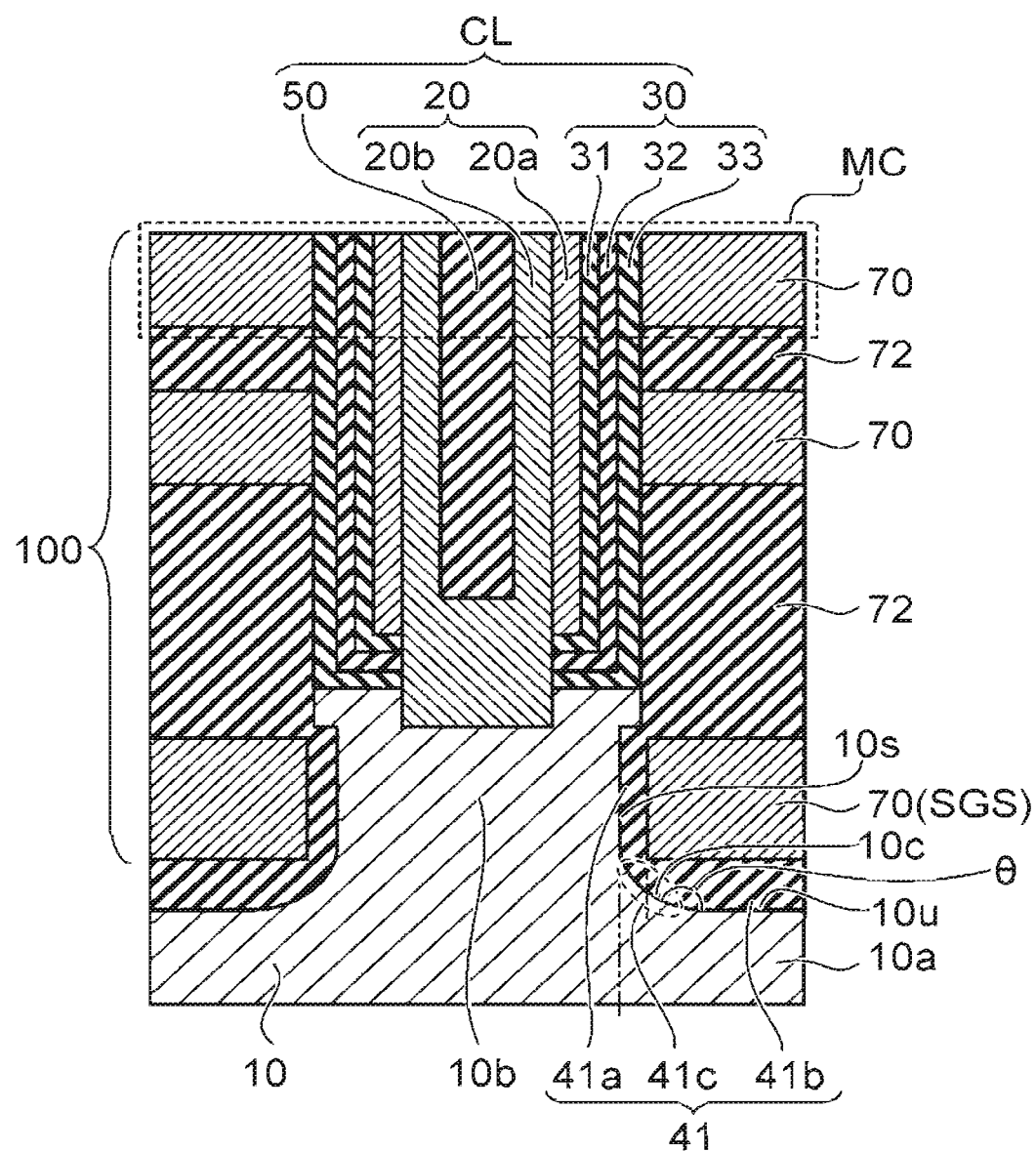
FIGS. 3 and 4 are enlarged schematic cross-sectional views of a portion A of FIG. 2.

FIG. 3 is an enlarged schematic cross-sectional view of a portion A of FIG. 2.

In FIG. 1, two mutually-orthogonal directions parallel to a major surface of a substrate 10 are taken as an X-direction and a Y-direction; and a direction orthogonal to both the X-direction and the Y-direction is taken as a Z-direction (a stacking direction). The Y-direction and the Z-direction shown in FIG. 2 correspond respectively to the Y-direction and the Z-direction of FIG. 1.

The memory cell array 1 includes the substrate 10, a stacked body 100 provided on the substrate 10, a plurality of columnar portions CL, a plurality of separation portions 60, and upper layer interconnects provided above the stacked body 100. In FIG. 1, for example, bit lines BL and a source line SL are shown as the upper layer interconnects.

The columnar portions CL are formed in circular columnar or elliptical columnar configurations extending in the stacking direction of the stacked body 100 (the Z-direction) through the stacked body 100. The separation portions 60 spread in the Z-direction and the X-direction on the substrate 10, and divide the stacked body 100 into a plurality of blocks (or finger portions) 200 in the Y-direction.

For example, the columnar portions CL have a staggered arrangement. Or, the columnar portions CL may have a square lattice arrangement along the X-direction and the Y-direction.

The plurality of bit lines BL are provided above the stacked body 100. The bit lines BL are, for example, metal films extending in the Y-direction. The bit lines BL are separated from each other in the X-direction.

The upper ends of semiconductor bodies 20 of the columnar portions CL described below are connected to the bit lines BL via contacts Cb and contacts V1 shown in FIG. 1.

Some columnar portions CL are connected to one common bit line BL. The columnar portions CL that are connected to the common bit line BL include one columnar portion CL selected from each block (or finger portion) 200 separated in the Y-direction by the separation portions 60.

As shown in FIG. 2 and FIG. 3, the substrate 10 includes a first portion 10b and a second portion 10a. The substrate 10 including the first portion 10b and the second portion 10a is a semiconductor substrate, and is, for example, a silicon substrate containing mainly silicon.

The second portion 10a is a p-type silicon region (a p-type well) provided on the front surface side of the substrate 10.

The first portion 10b protrudes higher than an upper surface (a major surface) 10u of the second portion 10a. The first portion 10b is provided in a columnar configuration under the columnar portion CL. The plurality of first portions 10b are provided to correspond to the plurality of columnar portions CL.

As described below, the first portion 10b is a crystal layer epitaxially grown from the second portion 10a; and the first portion 10b and the second portion 10a are one body of a monocrystalline region. The first portion 10b has substantially the same crystal orientation as the crystal orientation of the second portion 10a.

The first portion 10b also is a p-type silicon region. For example, the first portion 10b and the second portion 10a contain boron as the p-type impurity. The p-type impurity concentrations (the boron concentrations) of the first portion 10b and the second portion 10a are higher than $1 \times 10^{15}$ cm$^{-3}$.

An insulating film 41 is provided between the stacked body 100 and the upper surface 10u of the second portion 10a. The stacked body 100 is provided on the insulating film 41.

The stacked body 100 includes a plurality of electrode layers 70. The electrode layers 70 are stacked, with an insulating layer (an insulator) 72 interposed, in a direction (the Z-direction) perpendicular to the major surface of the substrate 10 (the upper surface 10u of the second portion 10a). The electrode layers 70 are metal layers, and are, for example, tungsten layers or molybdenum layers.

As shown in FIG. 2, an insulating film 42 is provided on the uppermost electrode layer 70; and an insulating film 43 is provided on the insulating film 42. The insulating film 43 covers the upper ends of the columnar portions CL.

The lowermost electrode layer 70 is provided on the insulating film 41. The insulating layer 72 is not provided between the insulating film 41 and the lowermost electrode layer 70. As described below, the lowermost electrode layer 70 functions as a source-side select gate SGS of a source-side select transistor STS. Accordingly, the lowermost electrode layer 70 also may be referred to using the reference numeral SGS.

The upper surface of the first portion 10b of the substrate 10 is positioned at a height higher than the upper surface of the lowermost electrode layer SGS, and lower than the lower surface of the second lowermost electrode layer 70. The upper surface of the first portion 10b is positioned at the side of the lowermost insulating layer 72.

The lowermost electrode layer SGS opposes a side surface 10s of the first portion 10b above the second portion 10a of the substrate 10. The lowermost electrode layer SGS is provided lower than a stacked film 30 of the columnar portion CL described below, and does not oppose the stacked film 30.

The insulating film 41 contains silicon oxide. The insulating film 41 includes a first insulating portion 41a and a second insulating portion 41b. The first insulating portion 41a is provided between the side surface 10s of the first portion 10b of the substrate 10 and the side surface of the lowermost electrode layer SGS. The lowermost electrode layer SGS surrounds, with the first insulating portion 41a interposed, the periphery of the first portion 10b having the columnar configuration.

The second insulating portion 41b of the insulating film 41 is provided between the upper surface 10u of the second portion 10a of the substrate 10 and the lower surface of the lowermost electrode layer SGS.

The distance between the lowermost electrode layer SGS and the second lowermost electrode layer 70 is greater than the distance between the other electrode layers 70. The thickness of the lowermost insulating layer 72 is thicker than the thicknesses of the other insulating layers 72.

As shown in FIG. 3, the columnar portion CL includes the stacked film (the memory film) 30, the semiconductor body 20, and an insulative core film 50. The semiconductor body 20, the stacked film 30, and the core film 50 extend in the stacking direction of the stacked body 100 on the first portion 10b of the substrate 10.

The semiconductor body 20 is formed in a pipe-like configuration; and the core film 50 is provided on the inner side of the semiconductor body 20. The stacked film 30 is provided between the semiconductor body 20 and the electrode layers 70 upper than the lowermost electrode layer SGS, and surrounds the periphery of the semiconductor body 20.

The semiconductor body 20 contains, for example, polycrystalline silicon. The semiconductor body 20 includes cover silicon 20a and a silicon body 20b. The cover silicon 20a is provided between the stacked film 30 and the silicon body 20b. The silicon body 20b is provided between the cover silicon 20a and the core film 50.

The lower end of the silicon body 20b is positioned lower than the lower end of the cover silicon 20a and contacts the first portion 10b of the substrate 10. The stacked film 30 is provided between the first portion 10b and the cover silicon 20a.

The upper end of the semiconductor body 20 is connected to the bit line BL via the contact Cb and the contact V1 shown in FIG. 1.

The stacked film 30 includes a tunneling insulating film 31, a charge storage film (a charge storage portion) 32, and a blocking insulating film 33. The blocking insulating film 33, the charge storage film 32, and the tunneling insulating film 31 are provided in order from the electrode layer 70 side between the semiconductor body 20 and the electrode layers 70 upper than the lowermost electrode layer SGS.

The semiconductor body 20, the stacked film 30, and the electrode layer 70 are included in a memory cell MC. One memory cell MC is schematically illustrated by a broken line in FIG. 3. The memory cell MC has a vertical transistor structure in which the electrode layer 70 surrounds, with the stacked film 30 interposed, the periphery of the semiconductor body 20.

In the memory cell MC having the vertical transistor structure, the semiconductor body 20 is a channel body; and the electrode layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film, and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32, or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the electrode layer 70. Also, the blocking insulating film 33 prevents back-tunneling of electrons from the electrode layer 70 into the columnar portion CL.

The blocking insulating film 33 includes, for example, a silicon oxide film. Or, a stacked film of a silicon oxide film and a metal oxide film having a higher dielectric constant than the silicon oxide film may be provided as the blocking insulating film 33 between the charge storage film 32 and the electrode layer 70.

As shown in FIG. 1, a drain-side select transistor STD is provided at the upper layer portion of the stacked body 100 (the upper end portion of the columnar portion CL). A source-side select transistor STS is provided at the lower layer portion of the stacked body 100. At least the uppermost electrode layer 70 functions as a control gate of the drain-side select transistor STD. At least the lowermost electrode layer SGS functions as a control gate of the source-side select transistor STS.

The memory cells MC are provided between the drain-side select transistor STD and the source-side select transistor STS. The memory cells MC, the drain-side select transistor STD, and the source-side select transistor STS are connected in series via the semiconductor body 20 of the columnar portion CL, and are included in one memory string. For example, the memory strings have a staggered arrangement in a planar direction parallel to the XY plane; and the memory cells MC are provided three-dimensionally in the X-direction, the Y-direction, and the Z-direction.

The separation portion 60 will now be described.

As shown in FIG. 2, the separation portion 60 includes an interconnect portion LI and an insulating film 63. The insulating film 63 is not shown in FIG. 1.

The interconnect portion LI spreads in the X-direction and the Z-direction, and is, for example, a film containing a metal. The insulating film 63 is provided at the side surface of the interconnect portion LI. The insulating film 63 is provided between the stacked body 100 and the interconnect portion LI.

A plurality of semiconductor regions 81 are formed in the front surface of the second portion (the p-type well) 10a of the substrate 10. The lower end of the interconnect portion LI contacts the semiconductor region 81. The plurality of semiconductor regions 81 are provided to correspond to the plurality of interconnect portions LI. The semiconductor regions 81 include an n-type semiconductor region 81 and a p-type semiconductor region 81.

The interconnect portions LI include the interconnect portion LI connected to the n-type semiconductor region 81, and the interconnect portion LI connected to the p-type semiconductor region 81.

The upper end of the interconnect portion LI connected to the n-type semiconductor region 81 is connected to the source line SL via a contact Cs shown in FIG. 1.

In a read-out operation, electrons are supplied from the interconnect portion LI to the semiconductor body 20 via the n-type semiconductor region 81, the second portion 10a and the first portion 10b of the substrate 10.

The upper end of the interconnect portion LI connected to the p-type semiconductor region 81 is connected to a not-shown upper layer interconnect. The p-type semiconductor region 81 supplies holes to the semiconductor body 20 via the second portion 10a and the first portion 10b of the substrate 10 in an erasing operation.

The lowermost electrode layer SGS functions as a control gate of the bottom transistor. The first insulating portion 41a and the second insulating portion 41b of the insulating film 41 shown in FIG. 3 function as a gate insulating film of the bottom transistor. The bottom transistor has a structure in which the lowermost electrode layer SGS surrounds, with the first insulating portion 41a interposed, the periphery of the first portion 10b of the substrate 10. Also, the lowermost electrode layer SGS opposes, with the second insulating portion 41b interposed, the upper surface 10u of the second portion 10a of the substrate 10.

The source-side select transistor STS includes at least the bottom transistor. Or, the source-side select transistor STS includes transistors in which the plurality of electrode layers 70 from the bottom including the lowermost electrode layer SGS are used as the control gates.

The control of a potential applied to the lowermost electrode layer SGS induces an inversion layer of the n-type (an n-channel) at the vicinity of the upper surface 10u of the p-type second portion 10a and the vicinity of the side surface 10s of the p-type first portion 10b. And then, a current can be caused to flow between the n-type semiconductor region 81 and the lower end of the semiconductor body 20.

Also, according to the embodiment, the substrate 10 includes a corner 10c continuing the side surface 10s of the first portion 10b and the upper surface 10u of the second portion 10a; and the inversion layer of the n-type (the n-channel) is induced at the vicinity of the corner 10c as well.

By appropriately controlling the p-type impurity concentrations of the first portion 10b and the second portion 10a, the bottom transistor can be caused to cut off without inducing the n-channel recited above when the potential of the lowermost electrode layer SGS is 0 V. In other words, a normally-off type source-side select transistor STS can be obtained. For example, it is desirable to set the p-type impurity concentrations (the boron concentrations) of the first portion 10b and the second portion 10a to be higher than $1 \times 10^{15}$ cm$^{-3}$ to realize normally-off.

According to the embodiment, the side surface 10s of the first portion 10b of the substrate 10 and the upper surface 10u of the second portion 10a are not continued directly to form a right angle. The upper surface 10u of the second portion 10a is continuous with the side surface 10s of the first portion 10b via the curved corner 10c.

Figure 4:
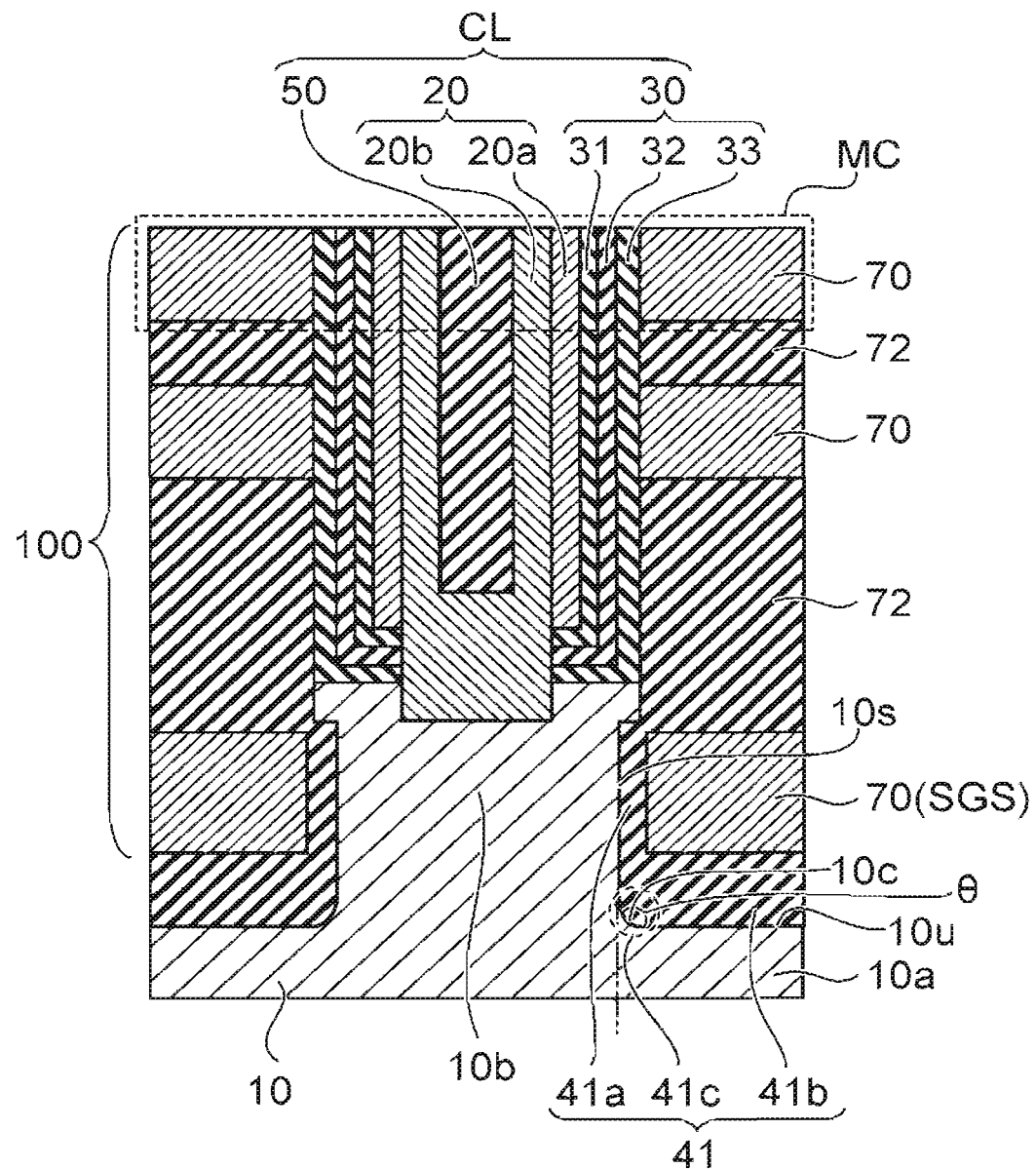

FIG. 4 is a schematic cross-sectional view similar to FIG. 3 showing another configuration of the corner 10c of the substrate 10. The corner 10c of the substrate 10 shown in FIG. 4 is curved to have a curvature larger than that of the corner 10c of the substrate 10 shown in FIG. 3.

The curvature of the corner 10c of the substrate 10 is smaller than the curvature of the corner between the lower surface and the side surface of the lowermost electrode layer SGS.

Figure 32A:
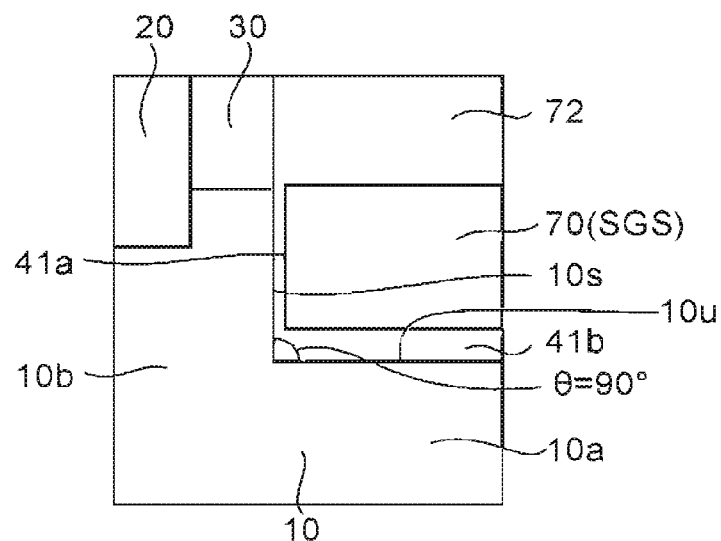
FIGS. 32A to 32C are schematic views showing simulation models of FIGS. 33A and 33B.
Figure 32B:
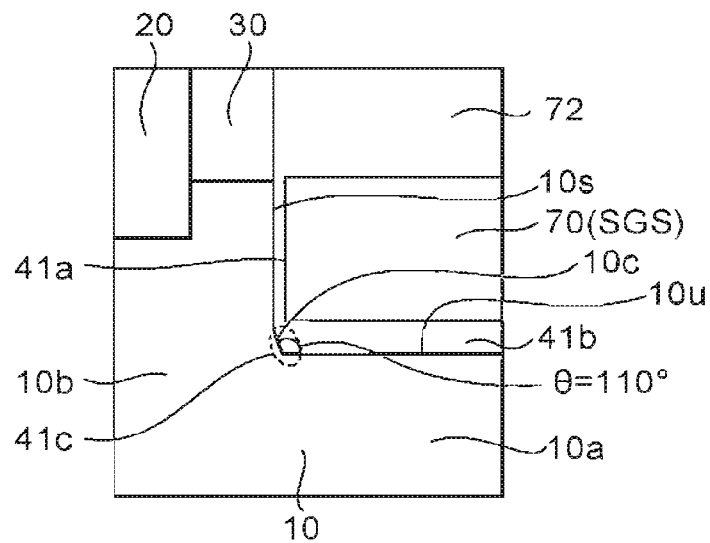
Figure 32C:
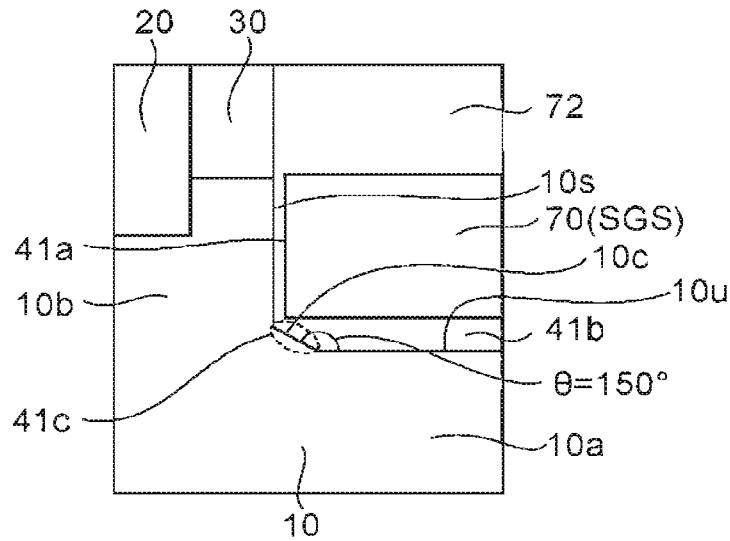

Or, as shown in FIG. 32B and FIG. 32C, the corner 10c that continues the upper surface 10u of the second portion 10a and the side surface 10s of the first portion 10b is tilted with respect to the upper surface 10u of the second portion 10a and the side surface 10s of the first portion 10b.

An angle θ formed between the upper surface 10u of the second portion 10a of the substrate 10 and the corner 10c of the substrate 10 on the insulating film 41 side is greater than 90°. In the case where the corner 10c is curved as shown in FIG. 3 and FIG. 4, the angle θ recited above can be defined by approximating the corner 10c as a set of tilted straight sections.

The insulating film 41 includes a corner portion 41c between the first insulating portion 41a and the second insulating portion 41b. The corner portion 41c is continuous with the first insulating portion 41a and the second insulating portion 41b. In the example shown in FIG. 3 and FIG. 4, the corner portion 41c of the insulating film 41 is rounded along the corner 10c of the substrate 10.

In the example shown in FIG. 32B and FIG. 32C, the corner portion 41c of the insulating film 41 is tilted with respect to the side surface 10s of the first portion 10b and the upper surface 10u of the second portion 10a along the corner 10c of the substrate 10.

The thickness of the second insulating portion 41b of the insulating film 41 is thicker than the thickness of the first insulating portion 41a. The distance between the upper surface 10u of the second portion 10a of the substrate 10 and the lower surface of the lowermost electrode layer SGS is greater than the distance between the side surface 10s of the first portion 10b of the substrate 10 and the side surface of the lowermost electrode layer SGS.

A first extension line (the single dot-dash line of FIG. 3) downward from the side surface of the lowermost electrode layer SGS intersects the corner 10c of the substrate 10. The thickness of the corner portion 41c of the insulating film 41 along the first extension line (the single dot-dash line of FIG. 3) is thinner than the thickness of the second insulating portion 41b.

In the case where the thickness of the second insulating portion 41b of the insulating film 41 is thicker than the first insulating portion 41a and the corner portion 41c, the induction of the n-channel at the vicinity of the upper surface 10u of the p-type second portion 10a of the substrate 10 controls the turn-on of the bottom transistor having the lowermost electrode layer SGS as the control gate when the voltage applied to the lowermost electrode layer SGS is increased.

This means that it is possible to adjust the threshold voltage of the bottom transistor by the p-type impurity concentration of the second portion 10a of the substrate 10. Because it is easier to control the p-type impurity concentration in the second portion 10a of the substrate 10 than in the first portion 10b of the substrate 10, it is favorable for adjusting the threshold voltage of the bottom transistor in a structure in which the thickness of the second insulating portion 41b of the gate insulating film of the bottom transistor is set to be particularly thick.

The corner 10c of the substrate 10 is positioned on the side more proximal to the lowermost electrode layer SGS than to a second extension line (the double dot-dash line of FIG. 3 and FIG. 4) downward from the side surface 10s of the first portion 10b of the substrate 10.

In the cross section shown in FIG. 3 and FIG. 4, the side surface 10s of the first portion 10b of the substrate 10 continues to the upper surface 10u of the second portion 10a of the substrate 10 via the corner 10c without changing the orientation to jut from the second extension line (the double dot-dash line) toward a region on the central axis side of the columnar first portion 10b of the substrate 10.

FIG. 32A shows the structure of a comparative example in which the side surface 10s of the first portion 10b of the substrate 10 and the upper surface 10u of the second portion 10a are continued directly by forming a right angle. The side surface 10s of the first portion 10b of the substrate 10 and the upper surface 10u of the second portion 10a are continued directly by forming the angle θ of 90° on the insulating film 41 side.

In the structure of the comparative example, the number of lines of electric force from the lowermost electrode layer SGS toward the substrate 10 locally decreases easily at the right-angle corner. Therefore, the channel resistance of the vicinity of the right-angle corner may increase, or the channel may be undesirably interrupted at the vicinity of the right-angle corner vicinity.

Also, there is a similar concern for such a problem in the case where the side surface 10s of the first portion 10b of the substrate 10 is formed to jut toward the central axis side of the first portion 10b of the substrate 10 from the second extension line downward from the side surface 10s. Also, in the case where the substrate corner itself is not formed and the substrate 10 does not include the first portion 10b, the potential of the electrode layer SGS does not easily affect the second portion 10a of the substrate 10 at the vicinity of the lower end of the semiconductor body 20; and the increase of the channel resistance, etc., may be caused.

In contrast, as in the embodiment, compared to the right-angle corner of the comparative example, more lines of electric force can be caused to pass through the corner 10c that is curved or tilted to have the angle θ greater than 90°. This makes it possible to apply an electric field higher than that of the comparative example to the vicinity of the corner 10c and induce electrons having a density higher than that of the comparative example in the vicinity of the corner 10c. The increase at the vicinity of the corner 10c of the channel resistance of the bottom transistor having the lowermost electrode layer SGS as the control gate can be suppressed. Accordingly, according to the embodiment, compared to the comparative example, the on-current of the bottom transistor can be set to be large.

Figure 33A:
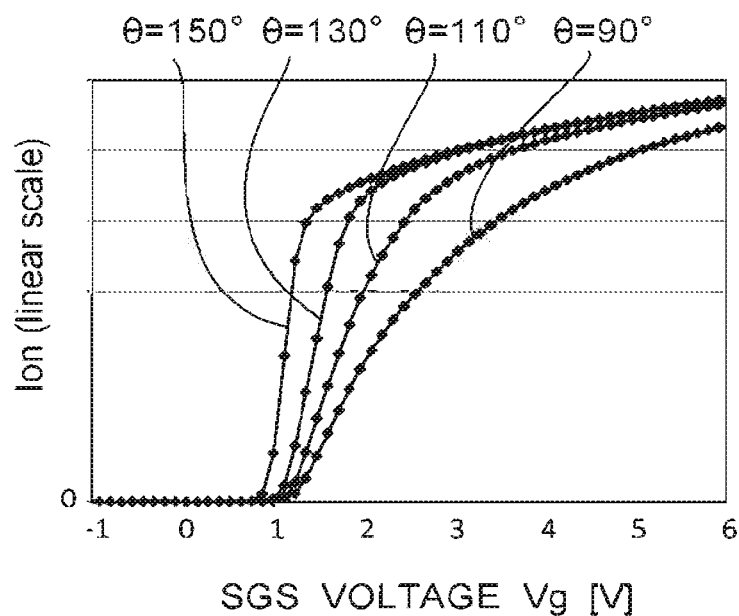
FIGS. 33A and 33B are graphs showing simulation results of Vg-Ion characteristics.

FIG. 33A shows the results calculated by technology CAD (TCAD) simulation of the Vg-Ion characteristics for the models shown in FIG. 32A to FIG. 32C.

The horizontal axis is a voltage Vg [V] of the lowermost electrode layer SGS. The vertical axis is an on-current Ion flowing through the inversion layer (the n-channel) induced in the first portion 10b and the second portion 10a of the substrate 10.

The characteristic for the angle θ=90° shows the characteristic of the model of the comparative example shown in FIG. 32A.

The characteristic for the angle θ=110° shows the characteristic of the model of the embodiment shown in FIG. 32B.

The characteristic for the angle θ=150° shows the characteristic of the model of the embodiment shown in FIG. 32C.

The model for the angle θ of 130° is not shown.

In each model, the dose of the p-type impurity (the boron) of the first portion 10b and the second portion 10a of the substrate 10 was set to $3 \times 10^{13}$ cm$^{-2}$; and the boron concentration was set to $1 \times 10^{17}$ cm$^{-3}$.

From the results of FIG. 33A, as the angle θ increases, the subthreshold swing value (the S value) and the threshold voltage decrease; and a large on-current Ion at turn-on is obtained.

Figure 33B:
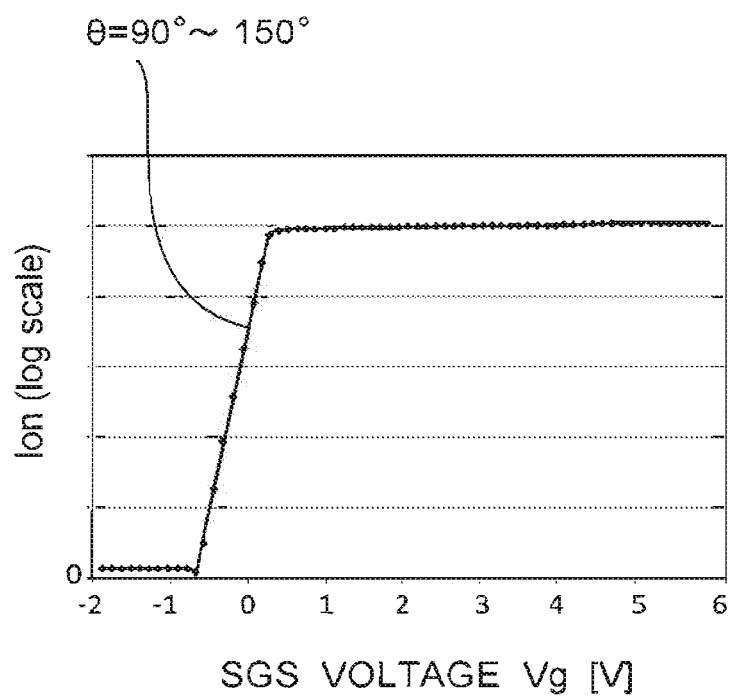

In the case where the boron concentration of the first portion 10b and the second portion 10a of the substrate 10 was set to $1 \times 10^{15}$ cm$^{-3}$, as shown in FIG. 33B, substantially the same Vg-Ion characteristic is obtained for each model; and Ion was independent of the angle θ. However, in the case where the boron concentration was $1 \times 10^{15}$ cm$^{-3}$, the current flowed even when Vg was not more than 0 V; and normally-off could not be realized.

A method for manufacturing the semiconductor device of the embodiment will now be described with reference to FIG. 5 to FIG. 31.

FIG. 5 to FIG. 16 are cross-sectional views of a portion corresponding to the cross section of FIG. 2.

FIG. 17 to FIG. 25 are cross-sectional views of a portion corresponding to the cross section of the right half of FIG. 3.

FIG. 26 to FIG. 31 are cross-sectional views of a portion corresponding to the cross section of the right half of FIG. 4.

Figure 5:
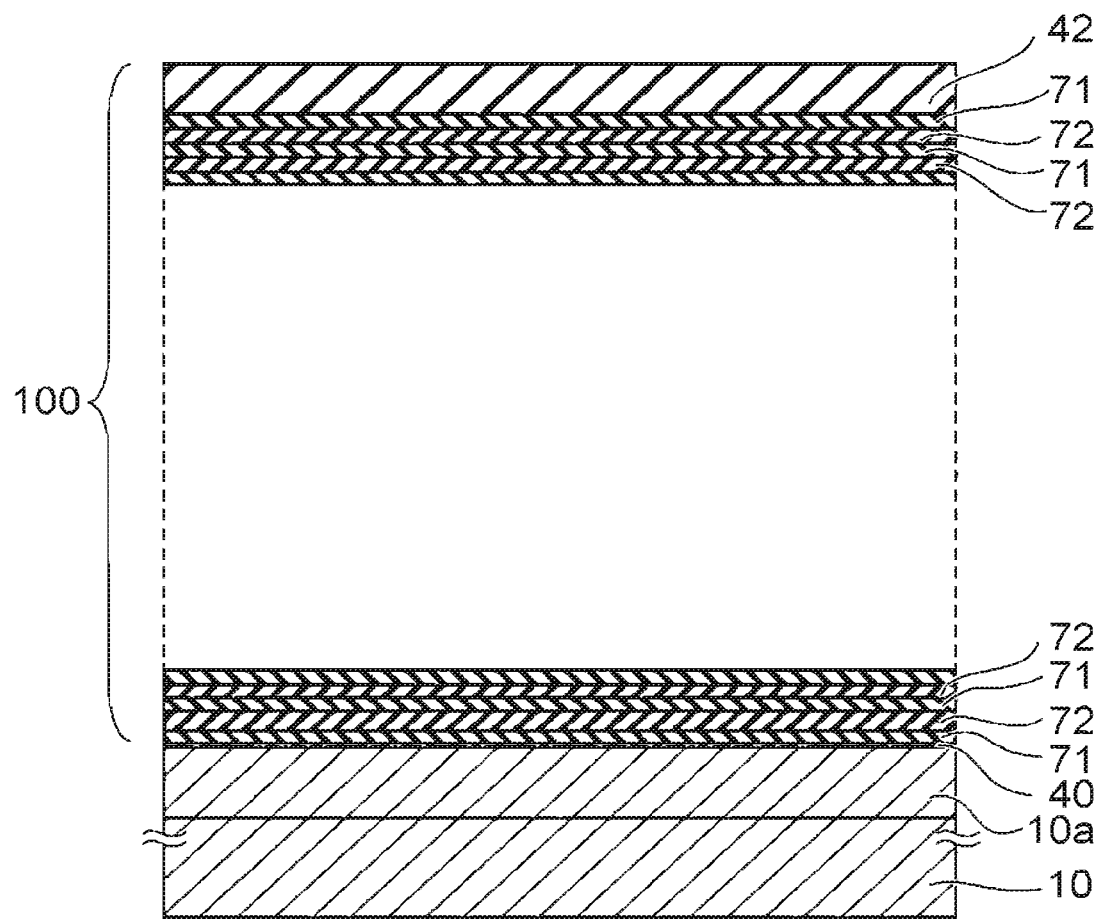
FIGS. 5 to 31 are schematic cross-sectional views showing a method for manufacturing the semiconductor device of the embodiment.

As shown in FIG. 5, the stacked body 100 is formed, with a foundation insulating film 40 interposed, on the second portion (the p-type well) 10a of the substrate 10. The substrate 10 is a silicon substrate containing silicon as a major component. The foundation insulating film 40 contains silicon oxide.

A sacrificial layer 71 as a first layer and the insulating layer 72 as a second layer are stacked alternately on the foundation insulating film 40. The process of alternately stacking the sacrificial layer 71 and the insulating layer 72 is repeated; and the plurality of sacrificial layers 71 and the plurality of insulating layers 72 are formed on the substrate 10.

The lowermost sacrificial layer 71 is formed on the foundation insulating film 40; and the insulating layer 72 is not provided between the foundation insulating film 40 and the lowermost sacrificial layer 71. The insulating film 42 is formed on the uppermost sacrificial layer 71. For example, the sacrificial layer 71 is a silicon nitride layer; and the insulating layer 72 is a silicon oxide layer.

Figure 6:
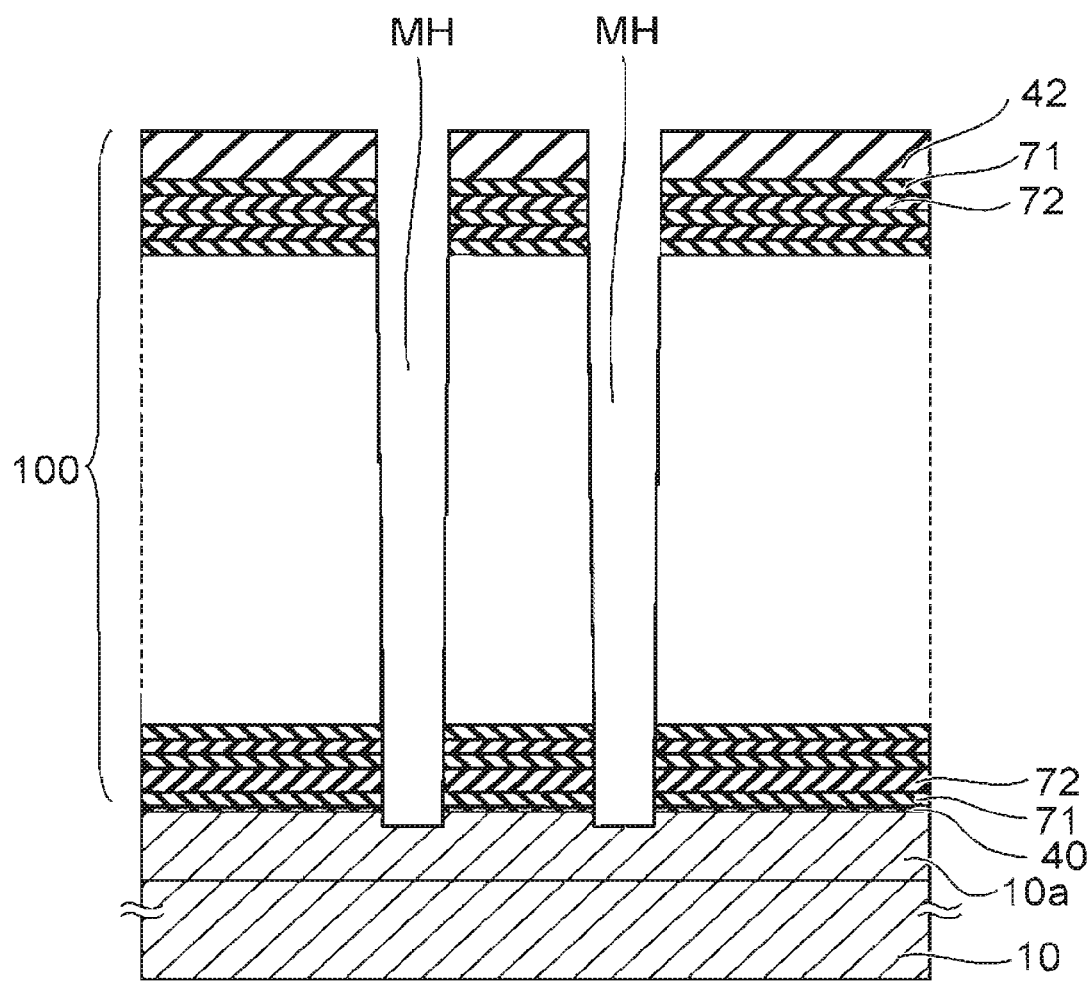
Figure 17:
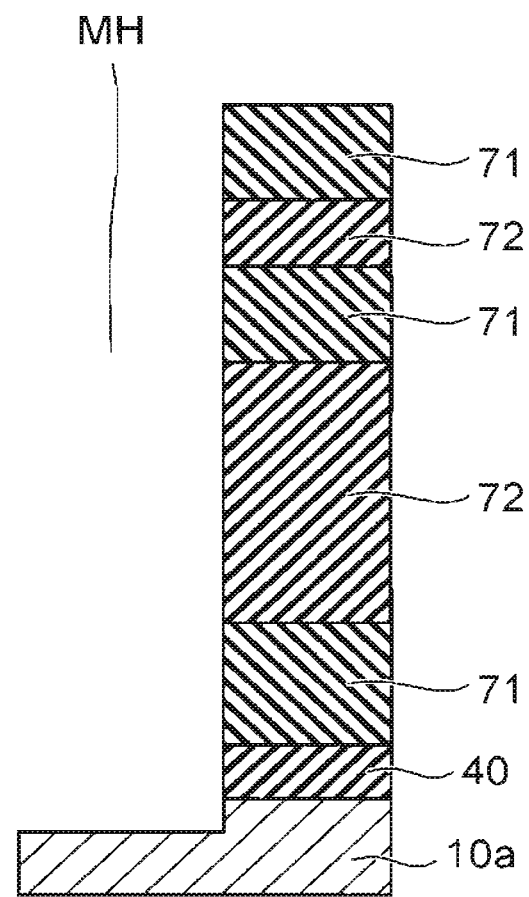

Then, as shown in FIG. 6 and FIG. 17, a plurality of memory holes MH are made by, for example, reactive ion etching (RIE) using a not-shown mask. The memory holes MH pierce the stacked body 100 and the foundation insulating film 40, and reach the second portion 10a of the substrate 10. The second portion 10a of the substrate 10 is exposed at the bottoms of the memory holes MH.

Figure 18:
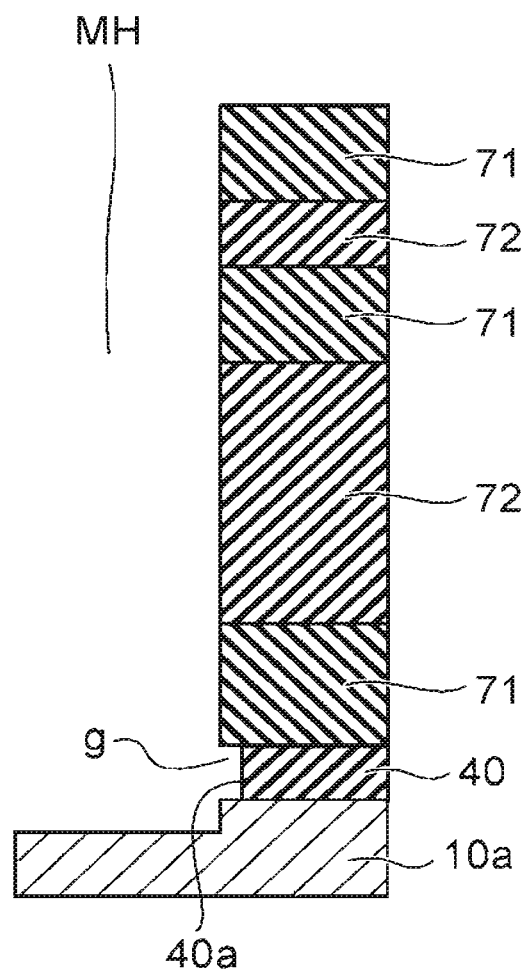

Side etching of the foundation insulating film 40 is performed as shown in FIG. 18 by the RIE that makes the memory holes MH or by another process after the RIE. An edge 40a of the foundation insulating film 40 on the memory hole MH side recedes from the side surface of the memory hole MH. A gap g that occurs due to the side etching of the foundation insulating film 40 is made between the lowermost sacrificial layer 71 and the second portion 10a of the substrate.

Figure 7:
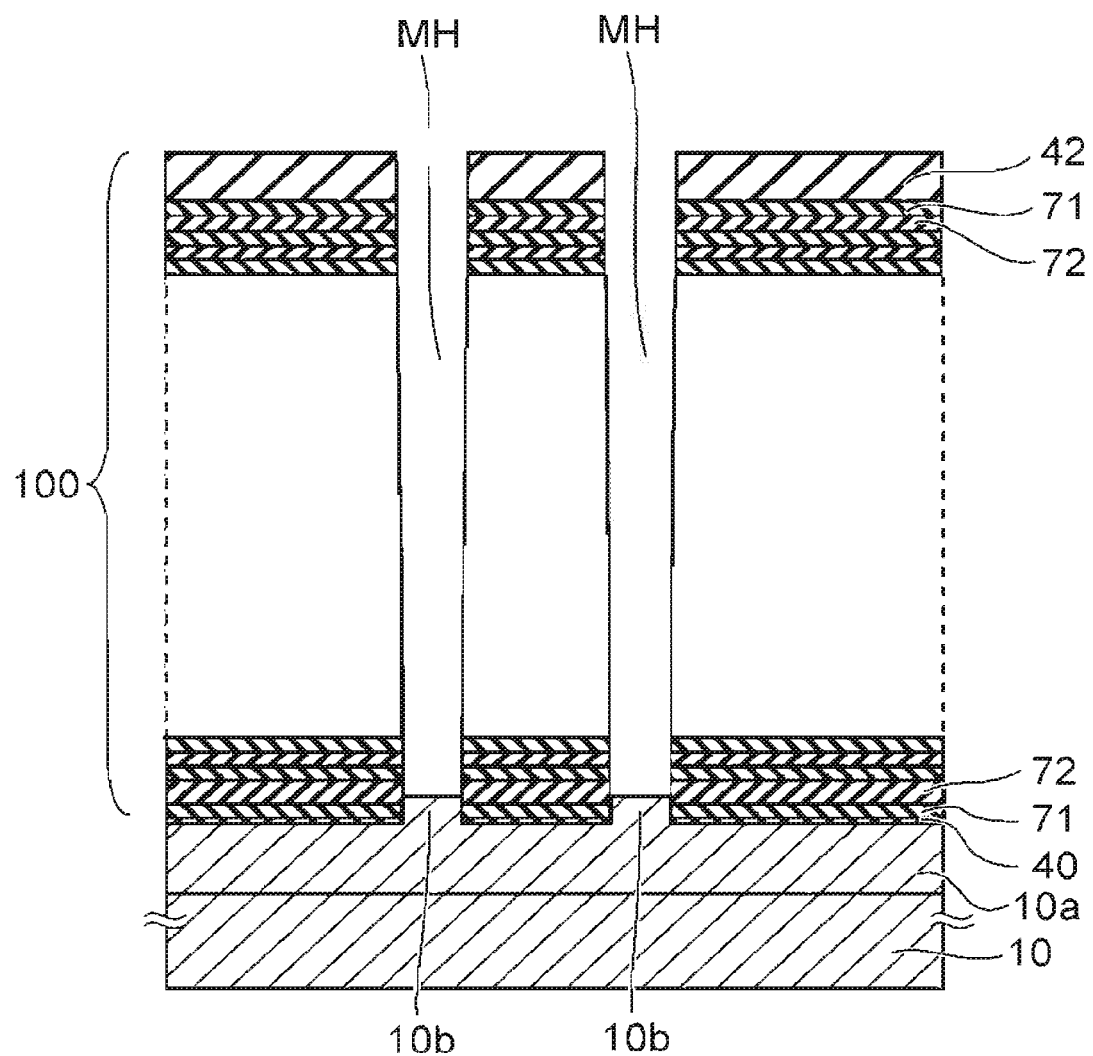
Figure 19:
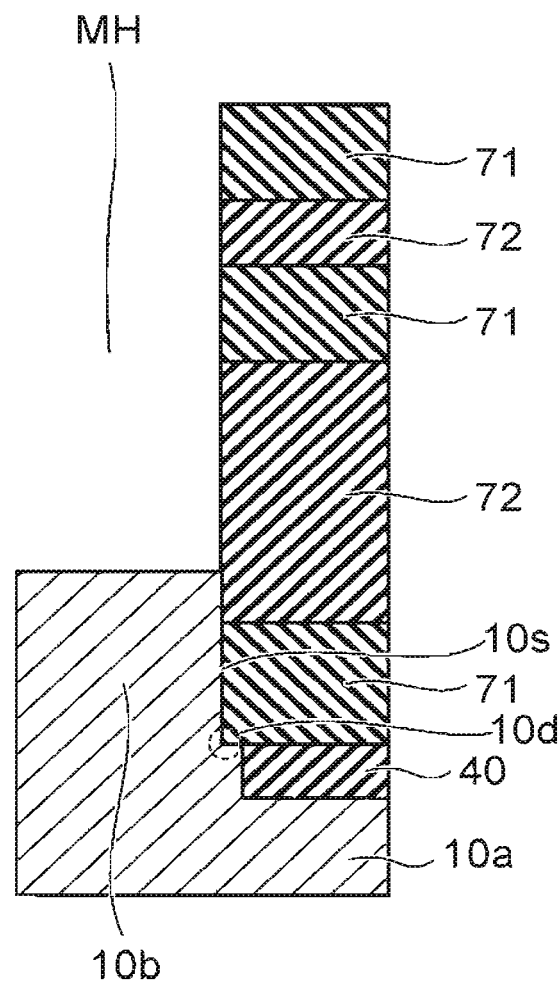

Then, silicon is epitaxially grown from the exposed portion of the second portion 10a at the bottoms of the memory holes MH. As shown in FIG. 7 and FIG. 19, the first portions 10b are formed as crystal layers of silicon at the bottoms of the memory holes MH.

The first portion 10b is grown to a height that is higher than the upper surface of the lowermost sacrificial layer 71, and lower than the upper surface of the lowermost insulating layer 72. Also, the first portion 10b is grown in the gap g made in the process of FIG. 18 as well. A corner 10d is formed in the portion from the side surface 10s of the first portion 10b continuing to the upper surface of the foundation insulating film 40.

Figure 8:
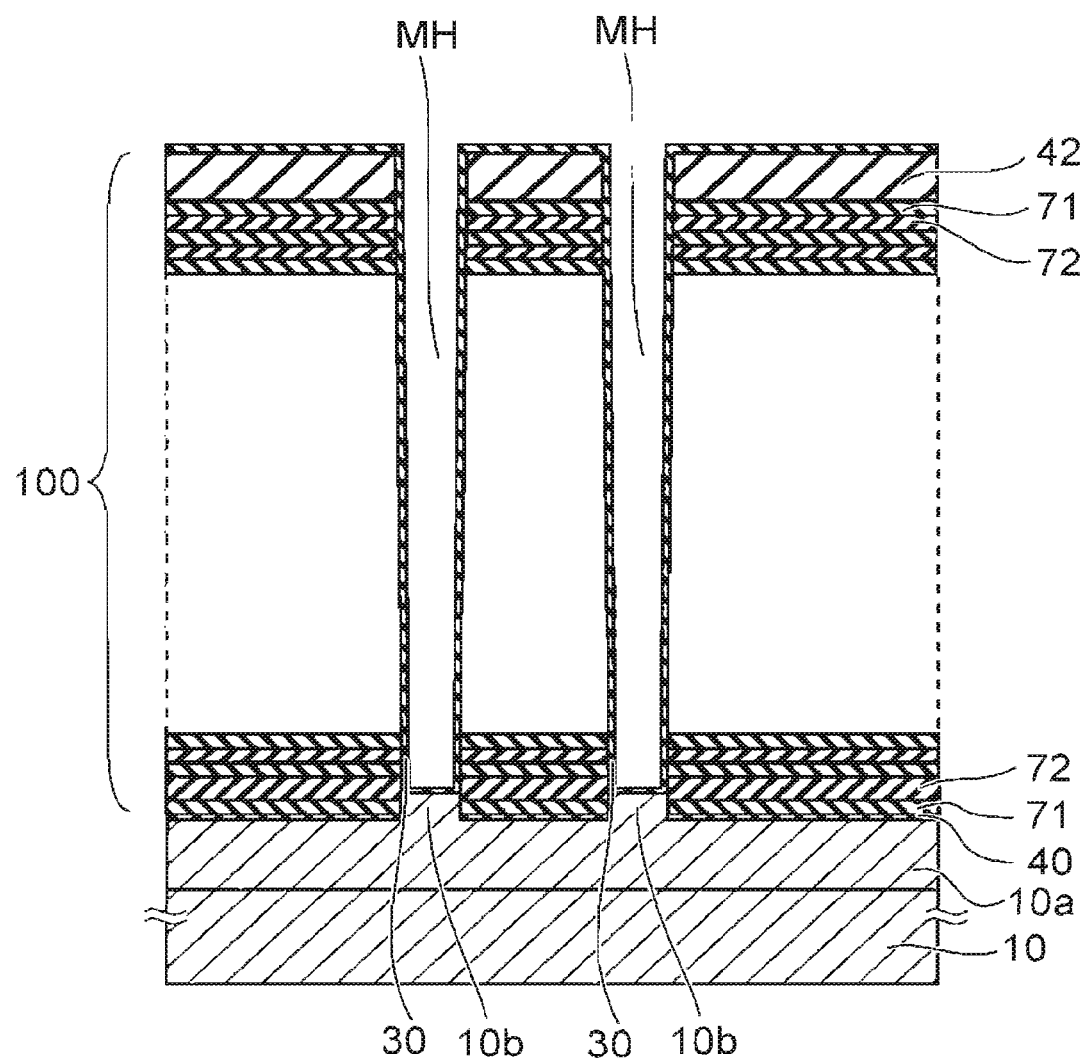

As shown in FIG. 8, the stacked film 30 is formed inside the memory holes MH on the first portions 10b. The stacked film 30 is formed conformally along the side surfaces of the memory holes MH and the upper surfaces of the first portions 10b.

Figure 9:
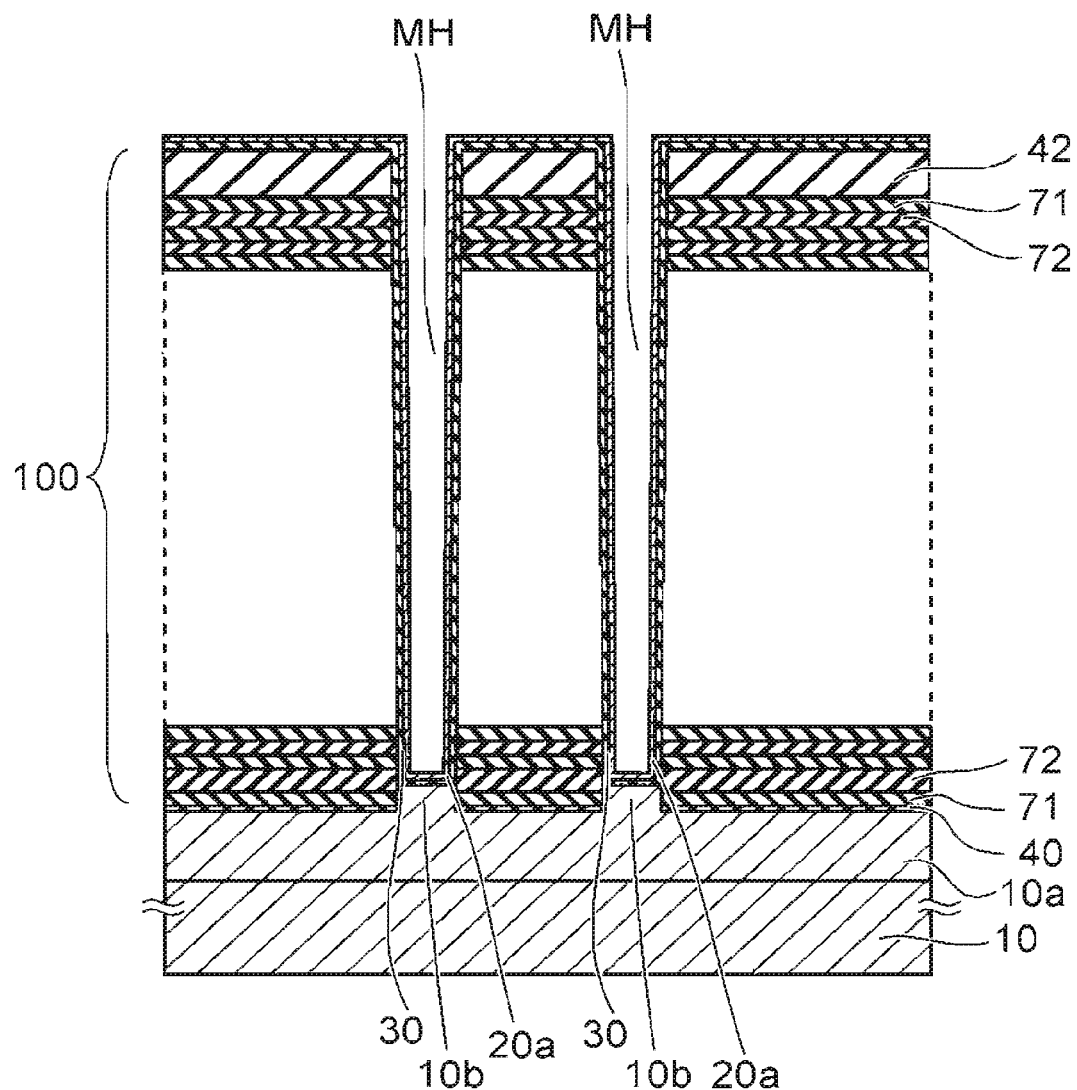

As shown in FIG. 9, the cover silicon 20a is formed on the inner side of the stacked film 30. The cover silicon 20a is formed conformally along the side surfaces of the memory holes MH and the upper surfaces of the first portions 10b.

Figure 10:
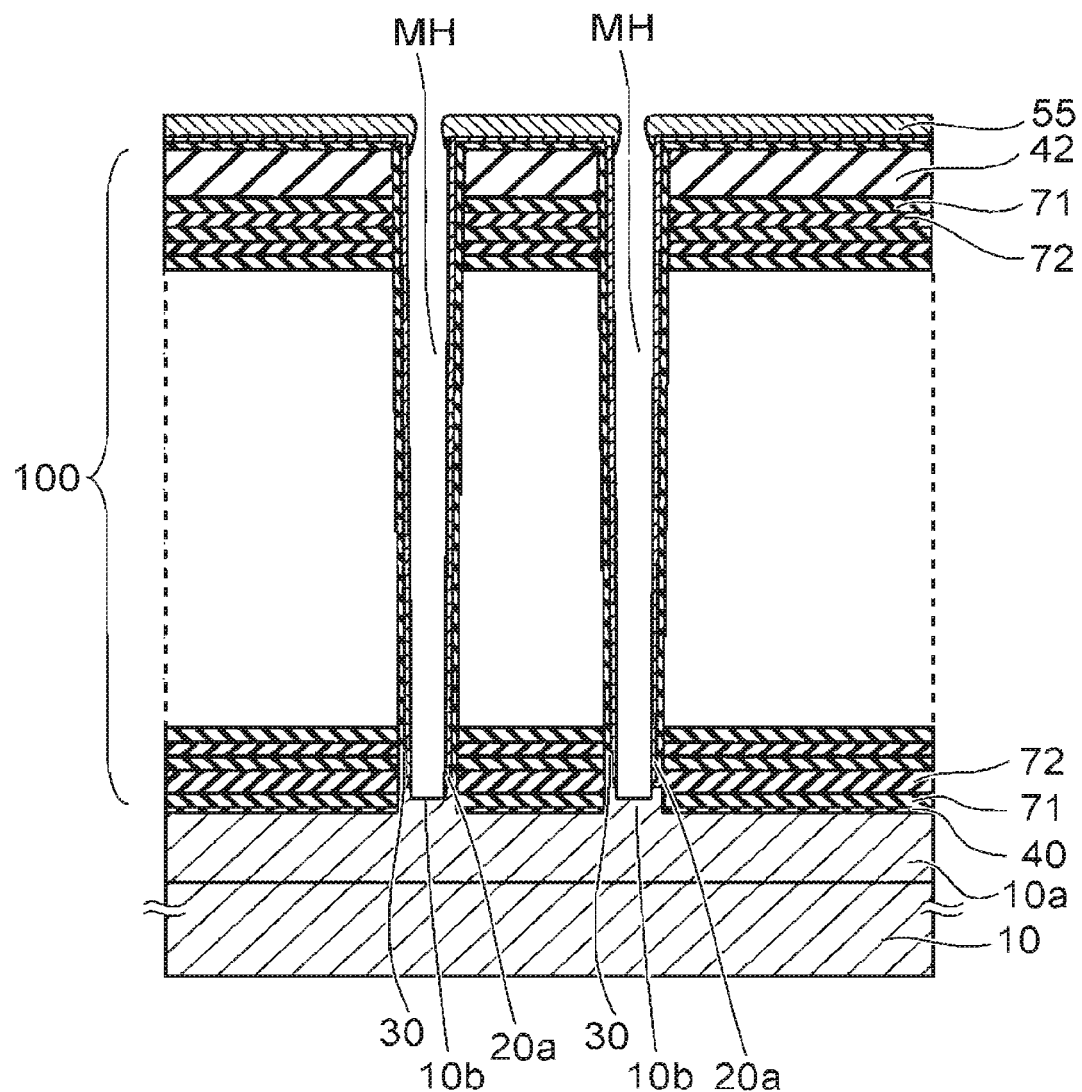

Then, as shown in FIG. 10, a mask layer 55 is formed on the stacked body 100; and the cover silicon 20a and the stacked film 30 deposited on the first portions 10b inside the memory holes MH are removed by RIE. The first portions 10b at the bottoms of the memory holes MH are exposed. In the RIE, the stacked film 30 formed on the side surfaces of the memory holes MH is covered with and protected by the cover silicon 20a and is not damaged by the RIE.

Figure 11:
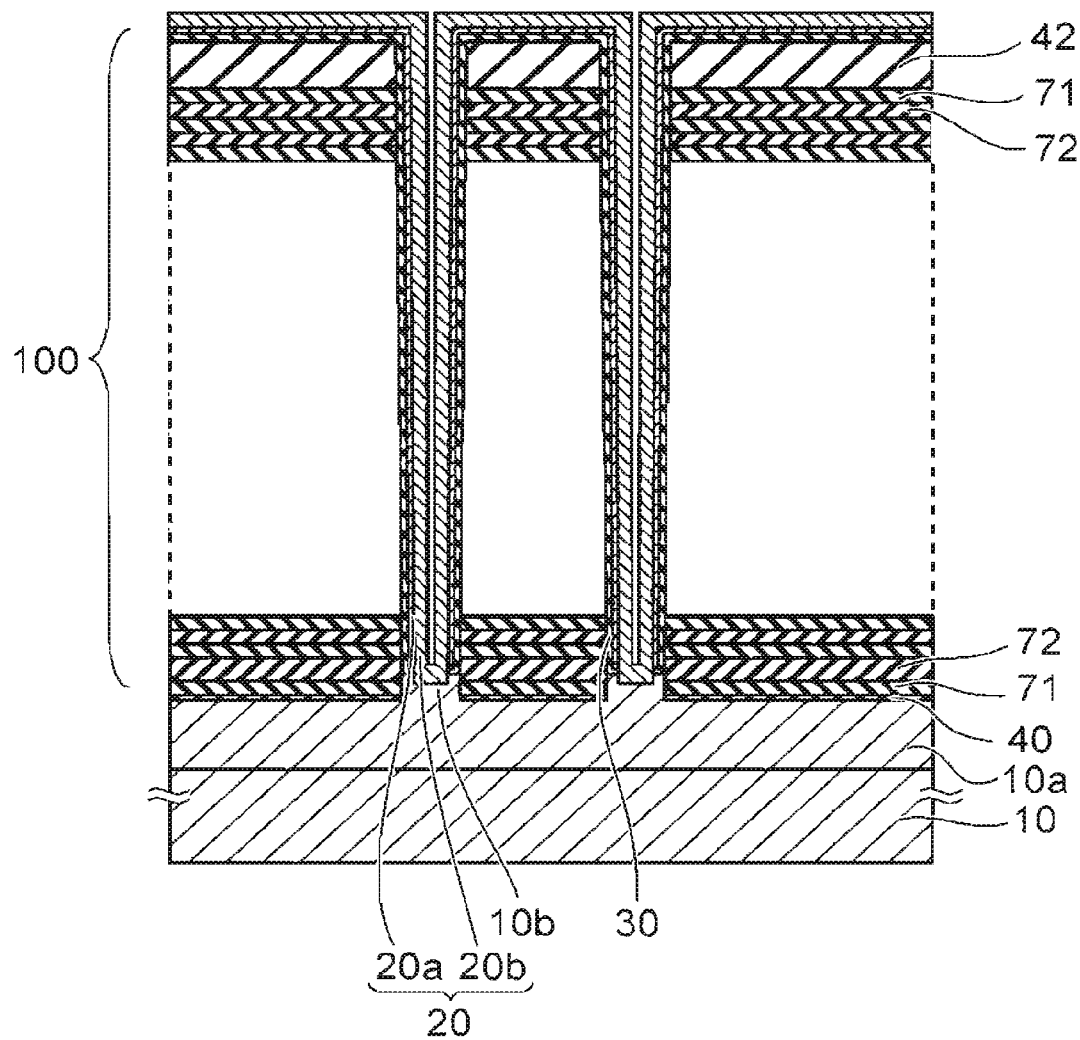
Figure 20:
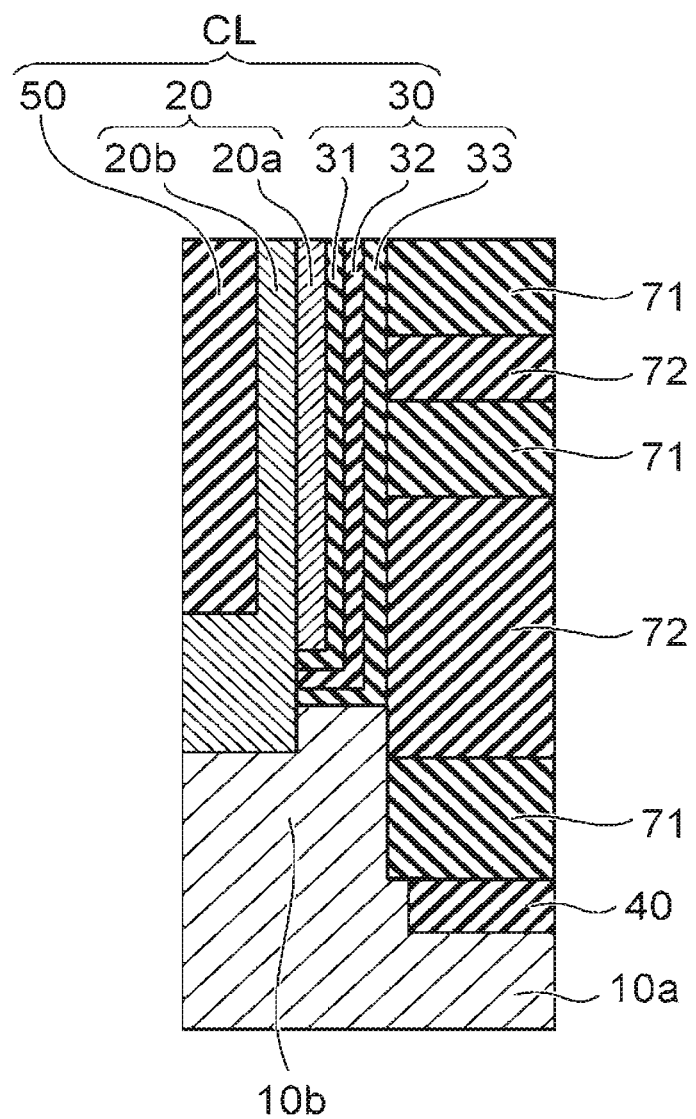

After removing the mask layer 55 as shown in FIG. 11 and FIG. 20, the silicon body 20b is formed inside the memory holes MH. The silicon body 20b is formed on the side surface of the cover silicon 20a and at the bottoms of the memory holes MH where the first portions 10b are exposed. The lower end portion of the silicon body 20b contacts the first portion 10b.

The cover silicon 20a and the silicon body 20b become the semiconductor body 20 described above by, for example, forming the cover silicon 20a and the silicon body 20b as amorphous silicon films and subsequently crystallizing the amorphous silicon films into polycrystalline silicon films by heat treatment.

Figure 12:
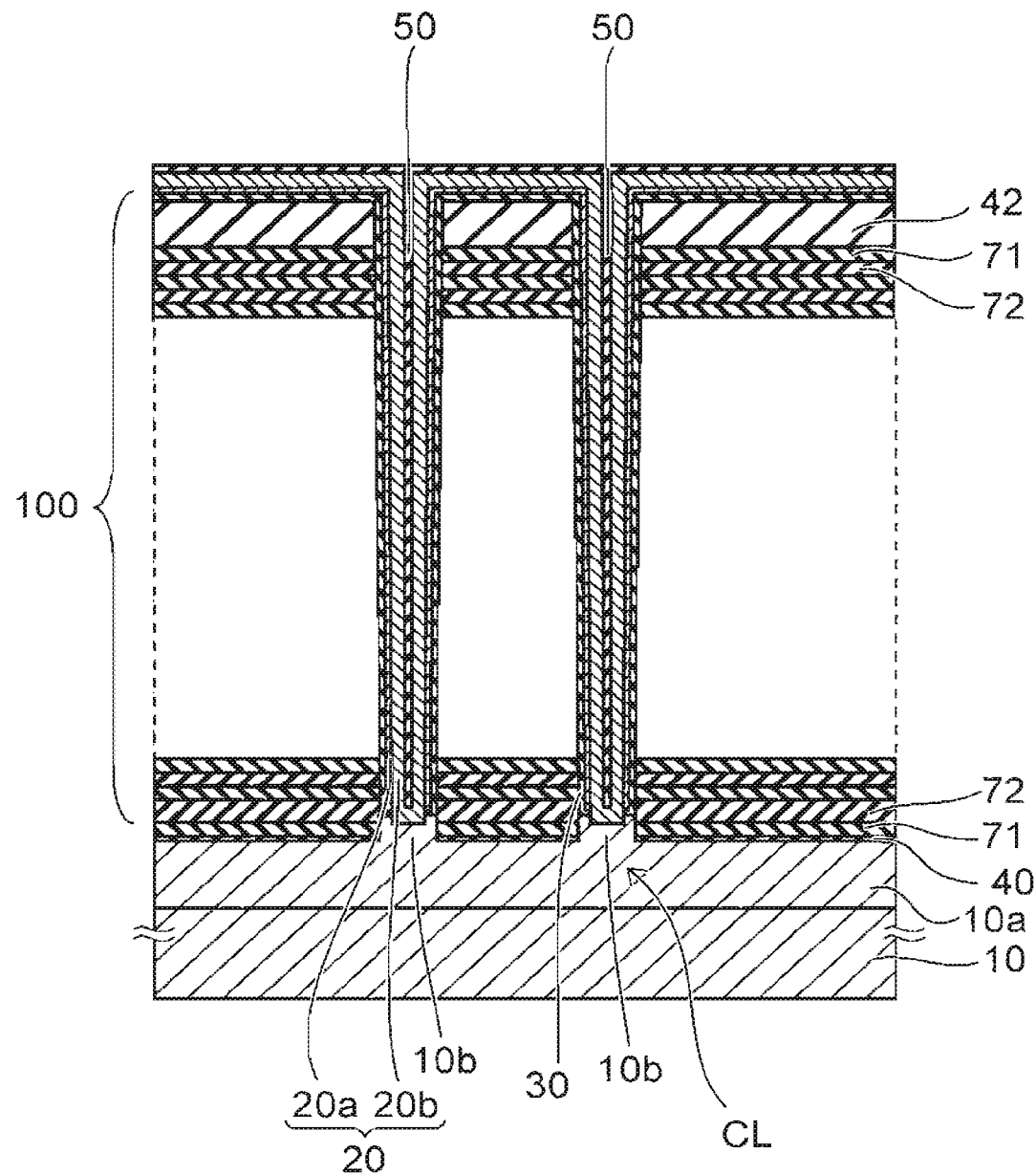

As shown in FIG. 12 and FIG. 20, the core film 50 is formed on the inner side of the silicon body 20b. The columnar portion CL that includes the stacked film 30, the semiconductor body 20, and the core film 50 is formed inside the stacked body 100.

Figure 13:
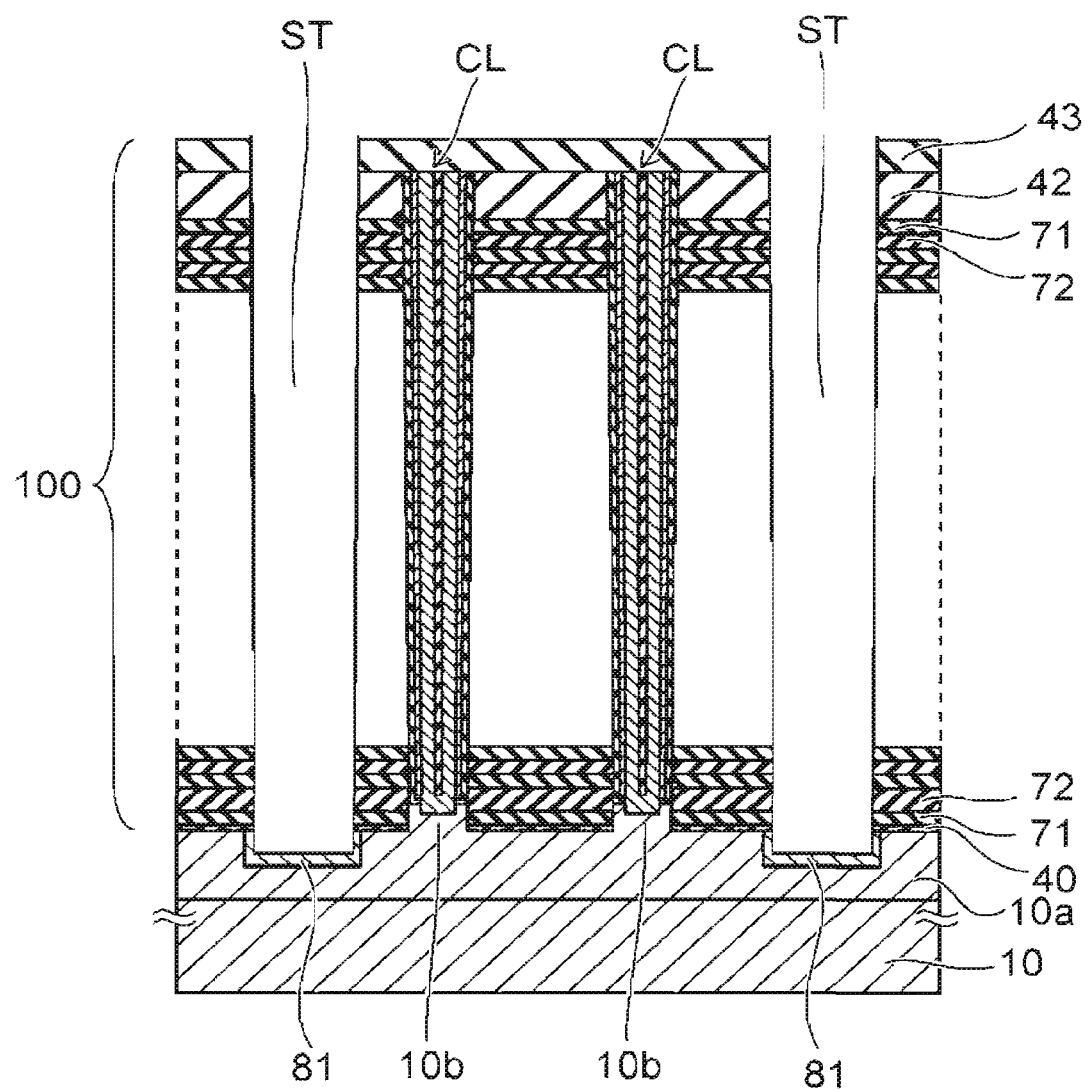

The films deposited on the insulating film 42 shown in FIG. 12 are removed by chemical mechanical polishing (CMP) or etch-back. Subsequently, as shown in FIG. 13, the insulating film 43 is formed on the insulating film 42. The insulating film 43 covers the upper ends of the columnar portions CL.

Figure 21:
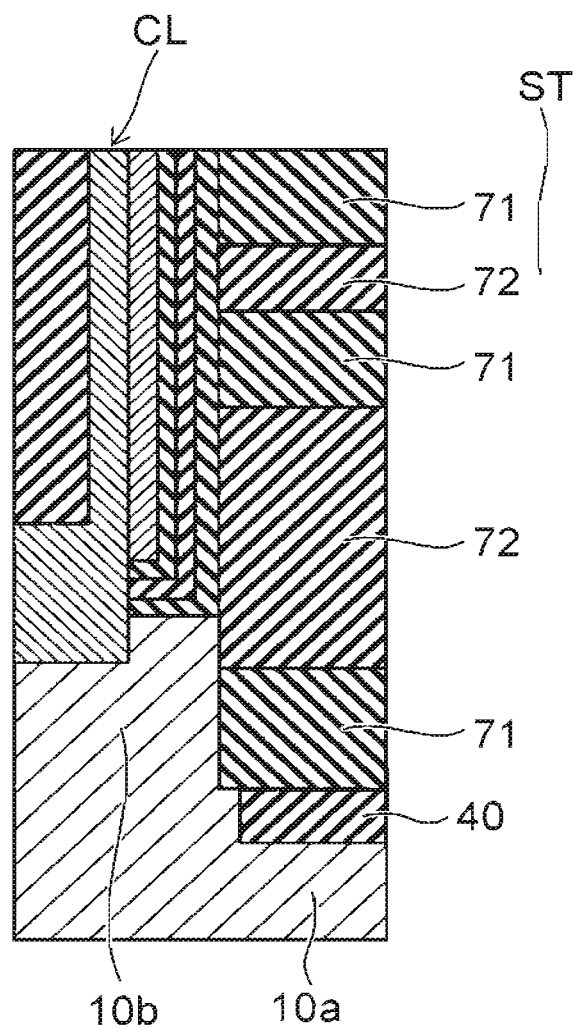

Then, as shown in FIG. 13 and FIG. 21, a plurality of slits ST that extend in the X-direction and the stacking direction of the stacked body 100 are made. The slits ST are made by RIE using a not-shown mask. The slits ST pierce the insulating film 43, the insulating film 42, the sacrificial layers 71, the insulating layers 72, and the foundation insulating film 40, and reach the second portion 10a of the substrate 10.

The n-type or p-type semiconductor region 81 is formed in the surface of the second portion 10a at the bottoms of the slits ST by implanting an impurity by ion implantation into the second portion 10a exposed at the bottoms of the slits ST.

Then, the sacrificial layers 71 are removed by an etchant or an etching gas supplied through the slits ST. For example, the sacrificial layers 71 which are silicon nitride layers are removed using an etchant containing phosphoric acid.

Figure 14:
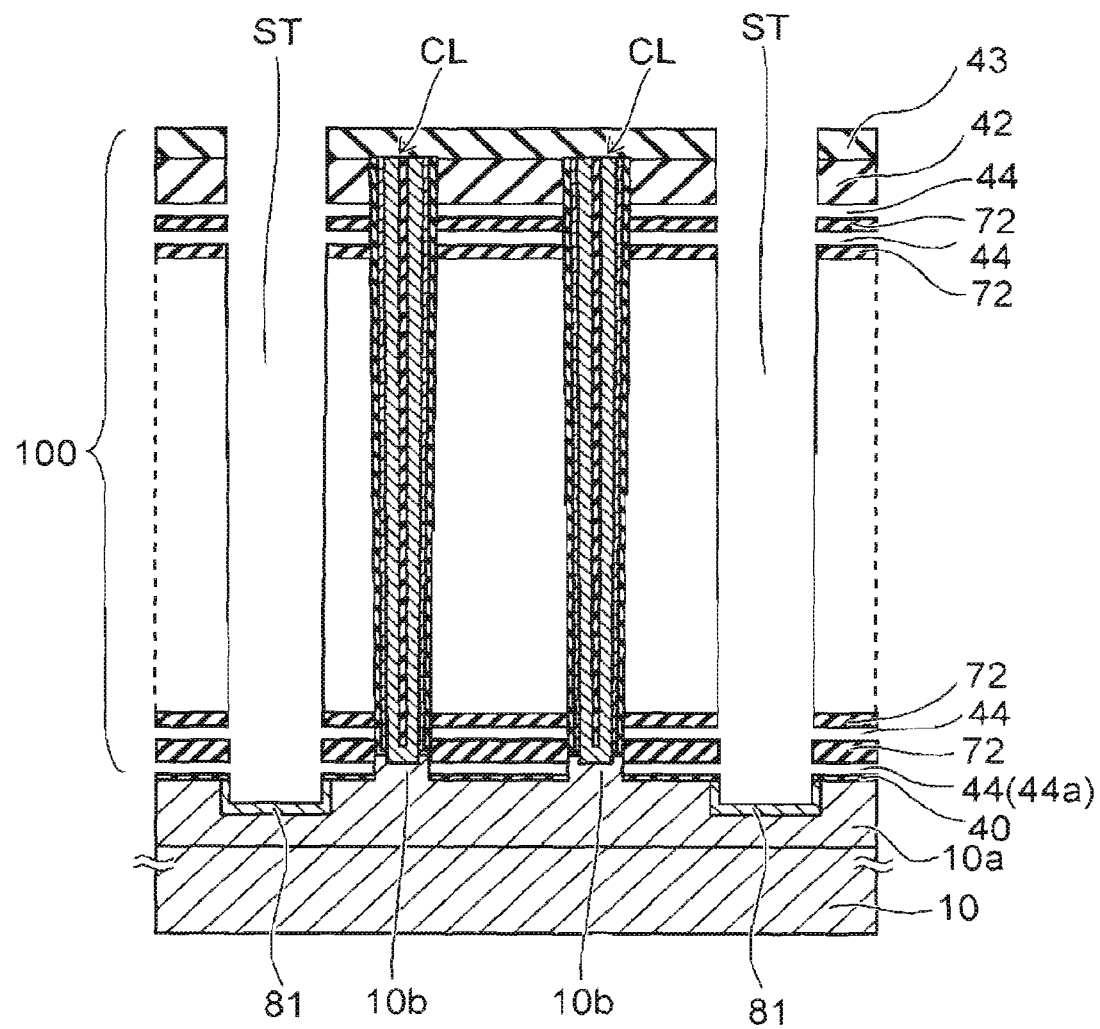
Figure 22:
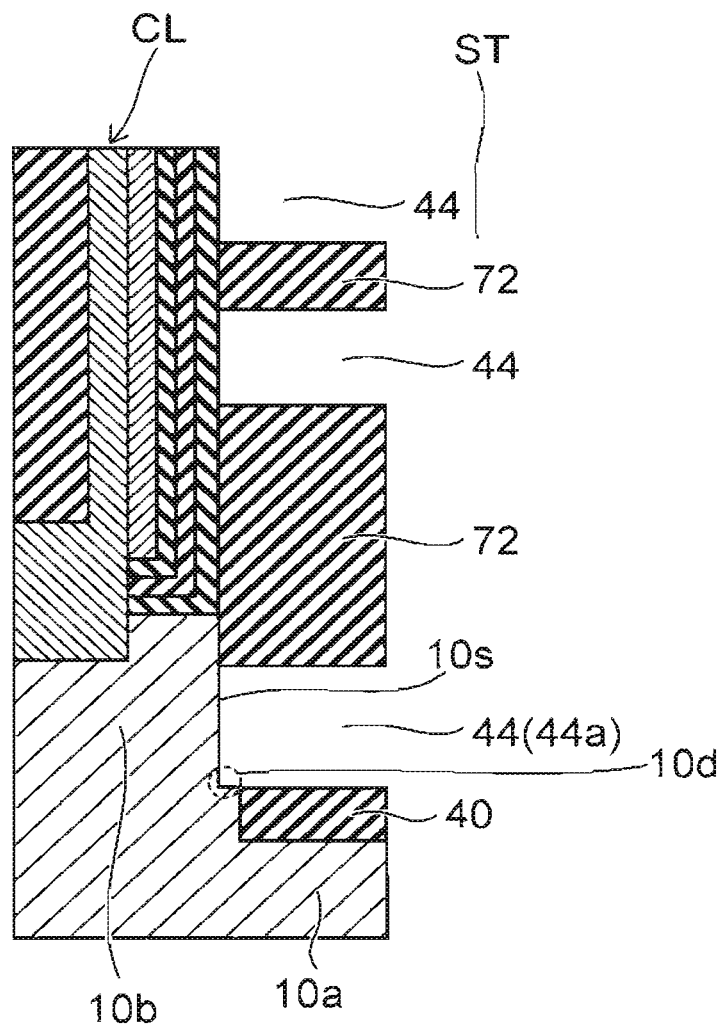

The sacrificial layers 71 are removed; and a gap 44 is made between the insulating layers 72 adjacent to each other above and below as shown in FIG. 14 and FIG. 22. The gap 44 is made also between the foundation insulating film 40 and the lowermost insulating layer 72, and between the insulating film 42 and the uppermost insulating layer 72.

The insulating layers 72 contact the side surfaces of the columnar portions CL to surround the side surfaces of the columnar portions CL. The insulating layers 72 are supported by such a physical bond with the columnar portions CL; and the gap 44 between the insulating layers 72 is maintained.

There are also cases where the gap 44 made between the foundation insulating film 40 and the lowermost insulating layer 72 is differentiated from the other gaps 44 and shown as a gap 44a. The side surface 10s of the first portion 10b of the substrate 10 is exposed in the gap 44a. Also, the corner 10d that continues from the side surface 10s of the first portions 10b to the upper surface of the foundation insulating film 40 is exposed in the gap 44a.

Figure 23:
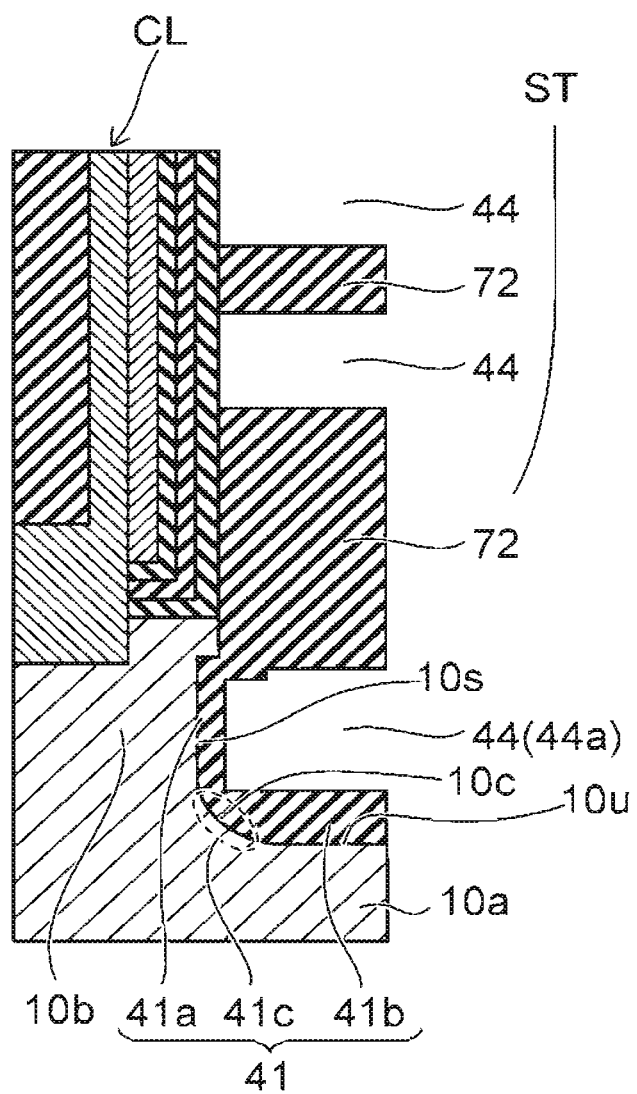

An insulating film is grown on the exposed portions of the portions containing silicon by thermal oxidation. As shown in FIG. 23, a silicon oxide film is formed, as the first insulating portion 41a of the insulating film 41, on the side surface 10s of the first portion 10b. The foundation insulating film 40 formed on the second portion 10a of the substrate 10 becomes the second insulating portion 41b of the insulating film 41.

Also, the oxidization of the corner 10d exposed in the gap 44a progresses; and the corner portion 41c of the insulating film 41 is formed between the first insulating portion 41a and the second insulating portion 41b as shown in FIG. 23. The oxidization of the corner 10d shown in FIG. 22 progresses from multiple directions; and the corners of the corner 10d are removed, or the curvatures of the corners of the corner 10d are dulled. The boundary between the substrate 10 and the portion oxidized from the corner 10d is curved as shown in FIG. 23.

Figure 15:
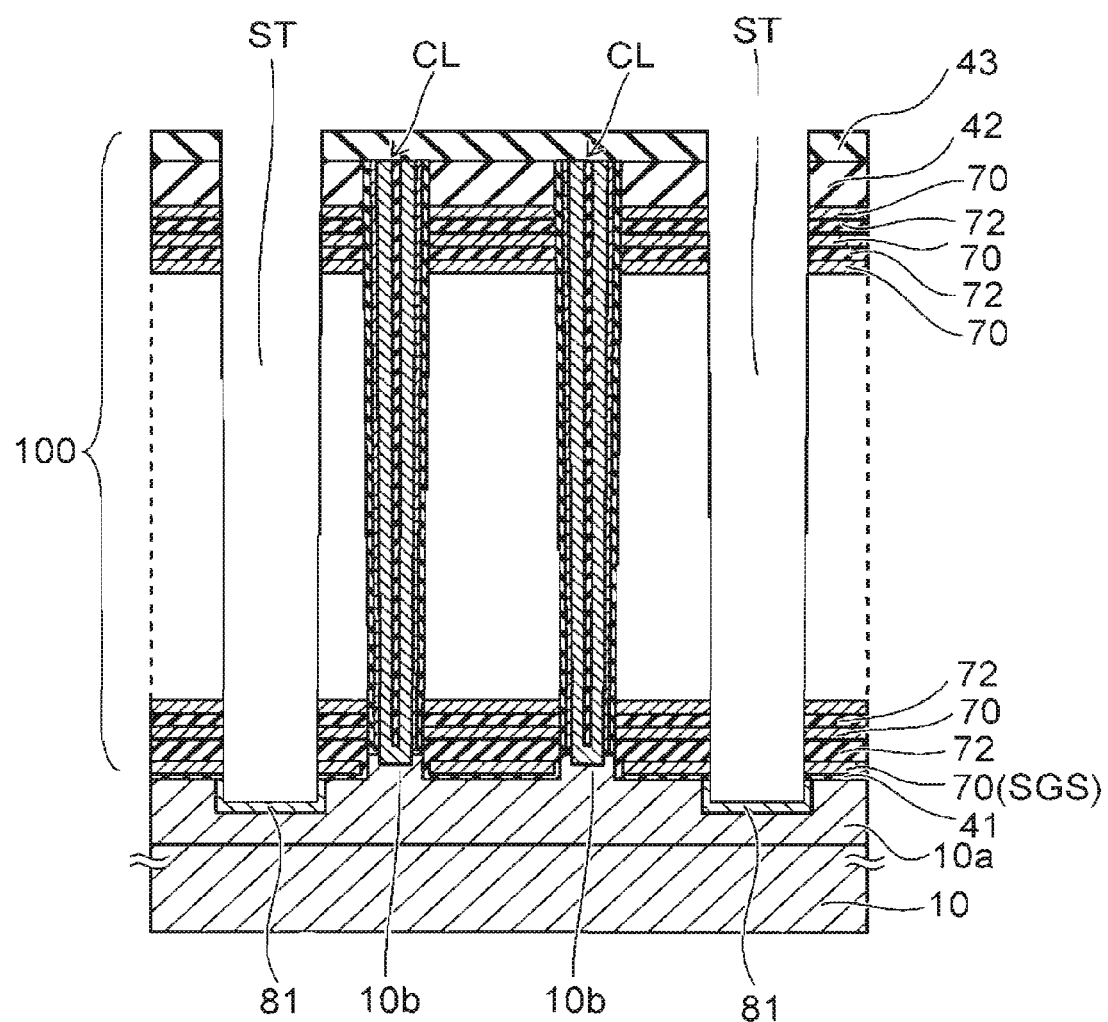
Figure 24:
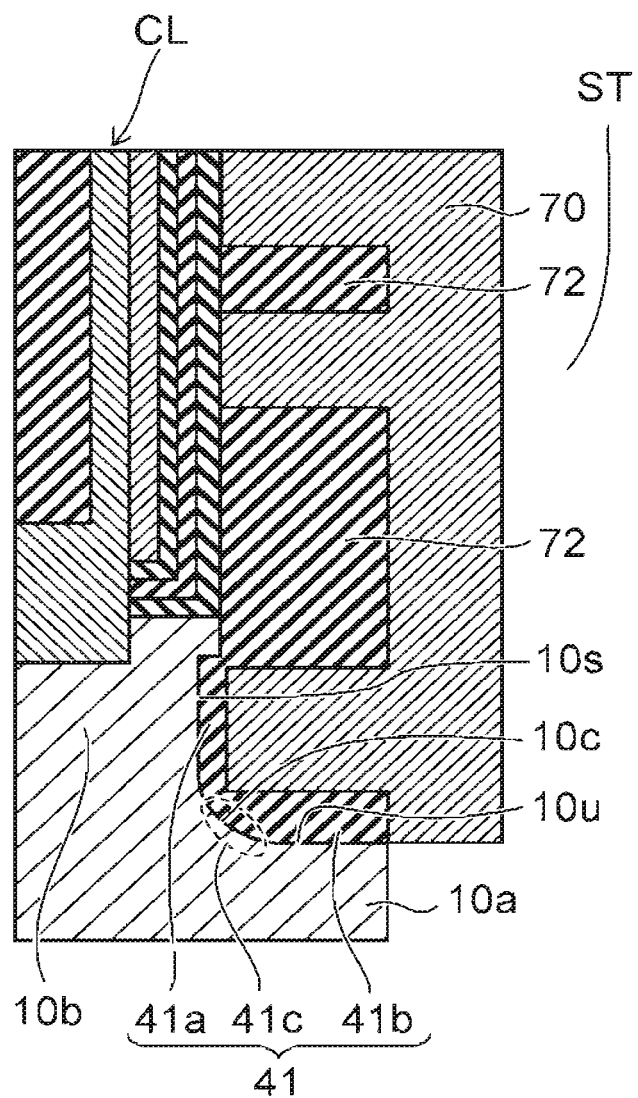

Subsequently, the electrode layer 70 shown in FIG. 15 and FIG. 24 is formed in the gap 44. For example, a tungsten layer or a molybdenum layer is formed as the electrode layer 70 by chemical vapor deposition (CVD). A source gas is supplied to the gap 44 through the slits ST.

Figure 25:
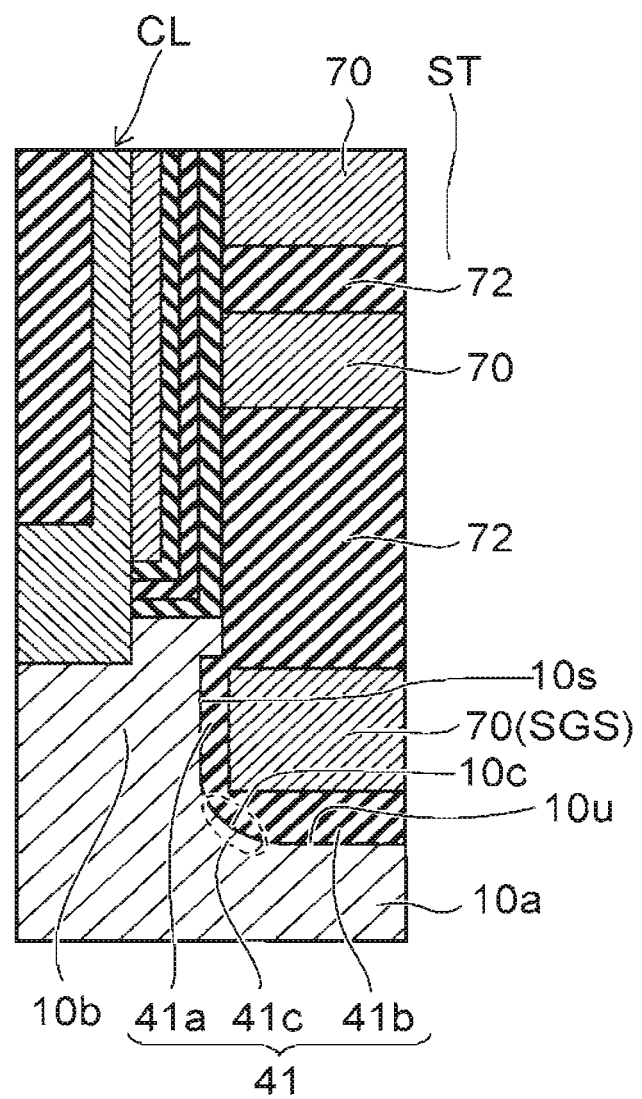

The electrode layer 70 formed on the side surfaces of the slits ST is removed as shown in FIG. 25; and the physical connection in the vertical direction between the electrode layers 70 is broken.

Figure 16:
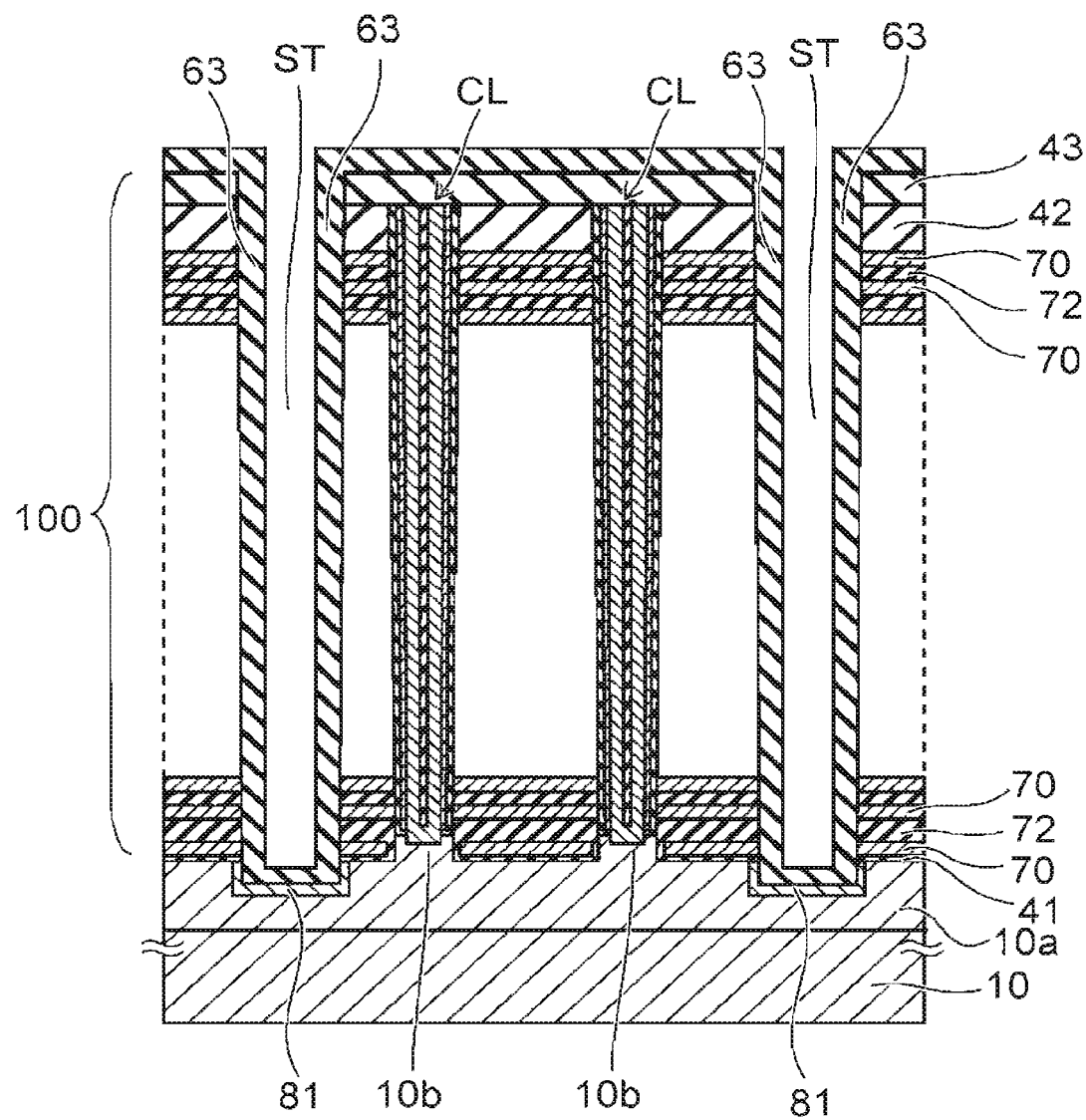

Subsequently, as shown in FIG. 16, the insulating film 63 is formed at the side surfaces and bottoms of the slits ST. After removing the insulating film 63 formed at the bottoms of the slits ST by RIE, the interconnect portion LI is filled onto the inner side of the insulating film 63 inside the slits ST as shown in FIG. 2. The lower end portion of the interconnect portion LI contacts the second portion 10a of the substrate 10 via the semiconductor region 81.

A method for forming the structure shown in FIG. 4 will now be described with reference to FIG. 26 to FIG. 31.

In the embodiment shown in FIG. 26 to FIG. 31, side etching of the foundation insulating film 40 is not performed after making the memory hole MH and prior to the epitaxial growth of the first portion 10b of the substrate 10.

Figure 26:
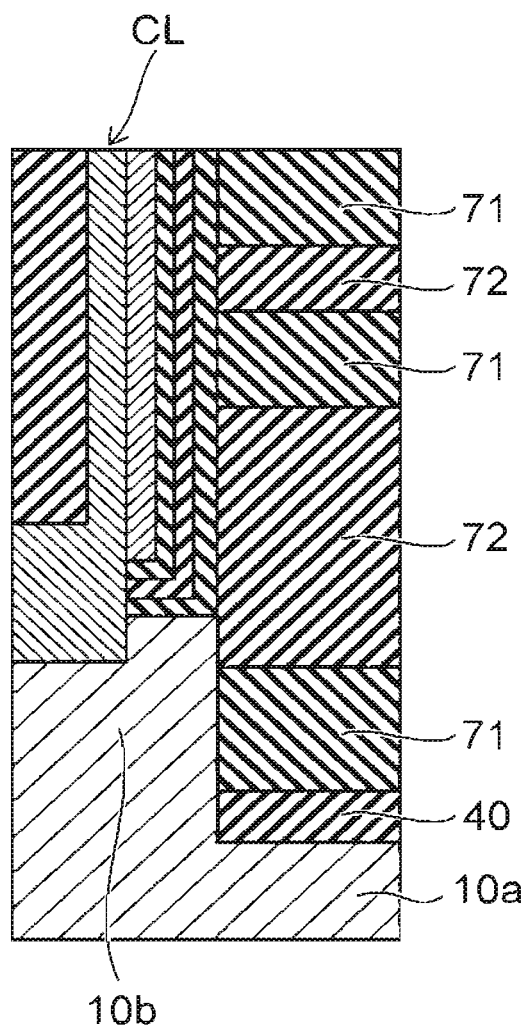

As shown in FIG. 26, the first portion 10b is formed; and the columnar portion CL is formed inside the memory hole MH on the first portion 10b without performing side etching of the foundation insulating film 40.

Figure 27:
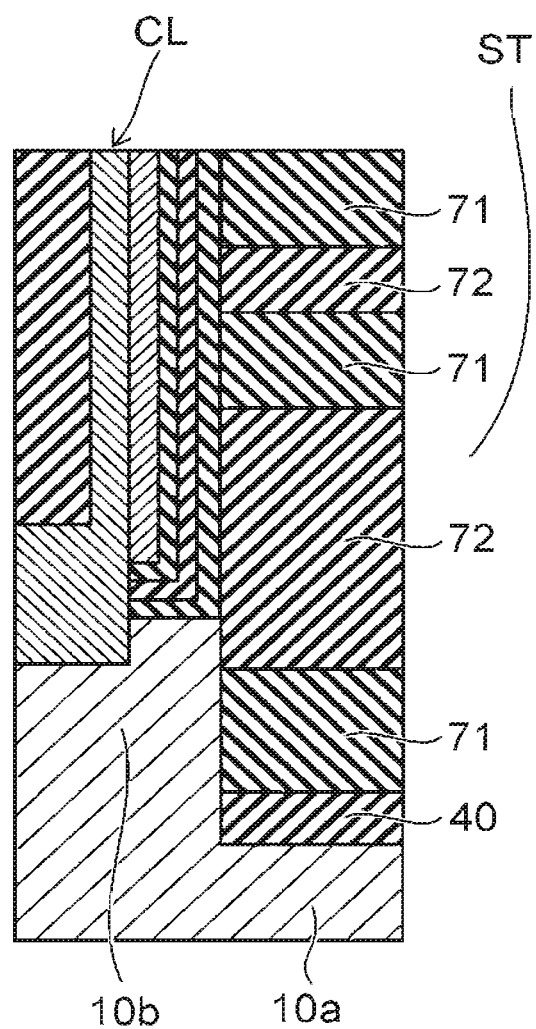
Figure 28:
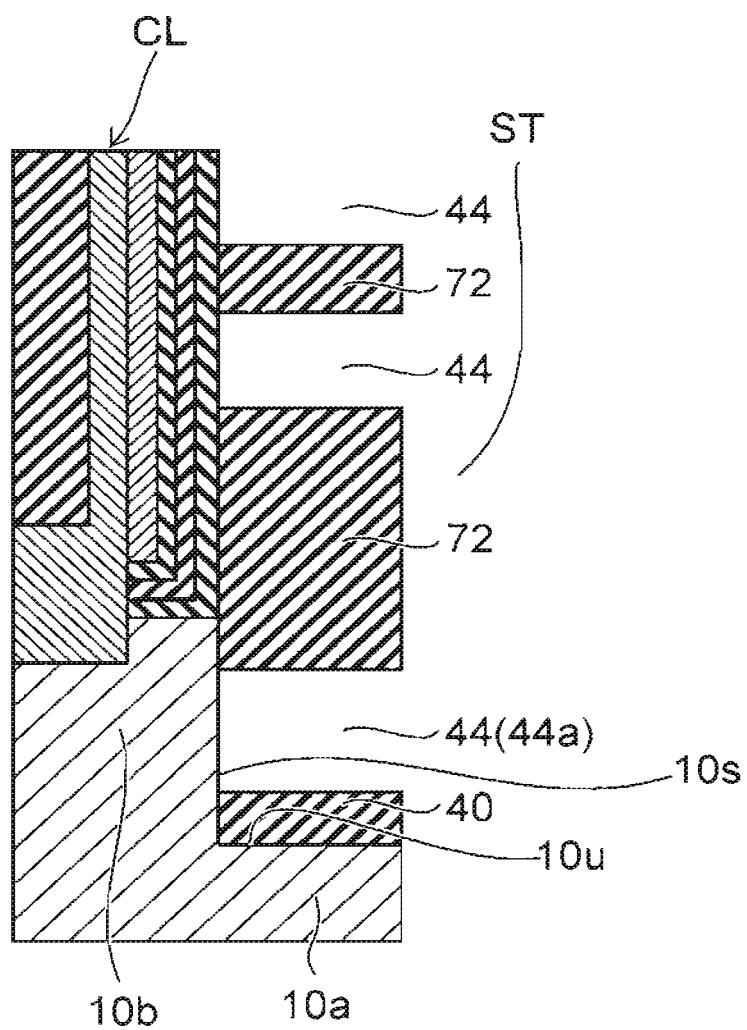

Then, after making the slit ST as shown in FIG. 27, the sacrificial layers 71 are removed by etching through the slit ST. The sacrificial layers 71 are removed; and the gap 44 is made as shown in FIG. 28.

The side surface 10s of the first portion 10b of the substrate 10 is exposed in the gap 44a made between the foundation insulating film 40 and the lowermost insulating layer 72. An insulating film is grown on the exposed portion by thermal oxidation.

Figure 29:
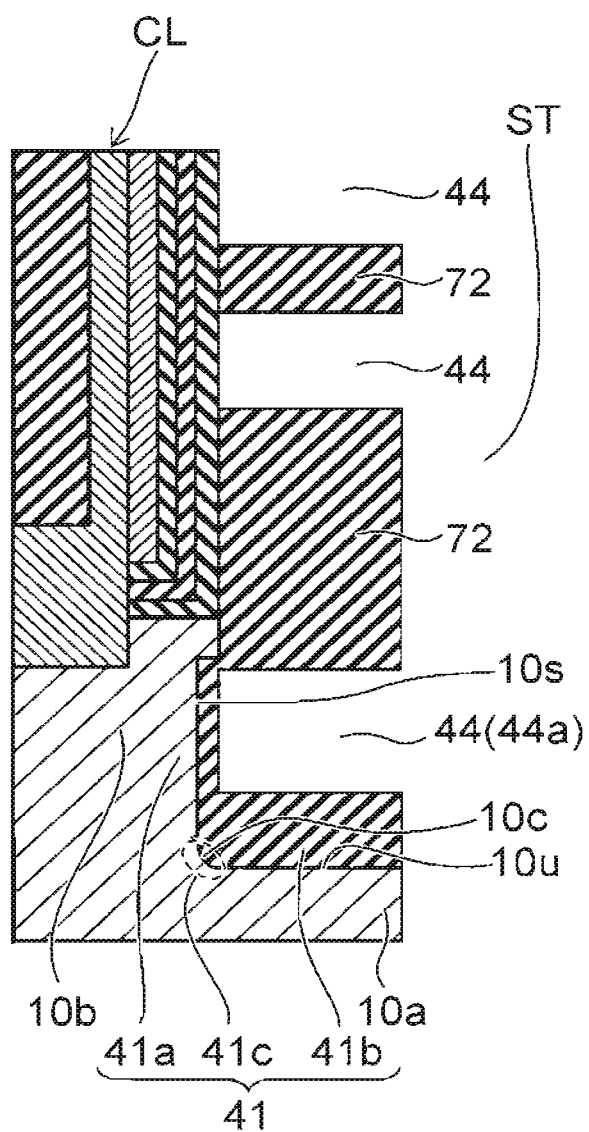

As shown in FIG. 29, a silicon oxide film is formed, as the first insulating portion 41a of the insulating film 41, at the side surface 10s of the first portion 10b.

Also, by controlling the thermal oxidation conditions, the oxidization progresses also from the upper surface 10u of the second portion 10a of the substrate 10; and the upper surface 10u recedes. The second insulating portion 41b thicker than the foundation insulating film 40 can be formed on the second portion 10a of the substrate 10.

Also, oxidization of the corner between the side surface 10s of the first portion 10b and the upper surface 10u of the second portion 10a progresses; and the corners of the corner are removed, or the curvatures of the corners of the corner are dulled. As shown in FIG. 29, the side surface 10s of the first portion 10b and the upper surface 10u of the second portion 10a are continued via the curved corner 10c.

Figure 30:
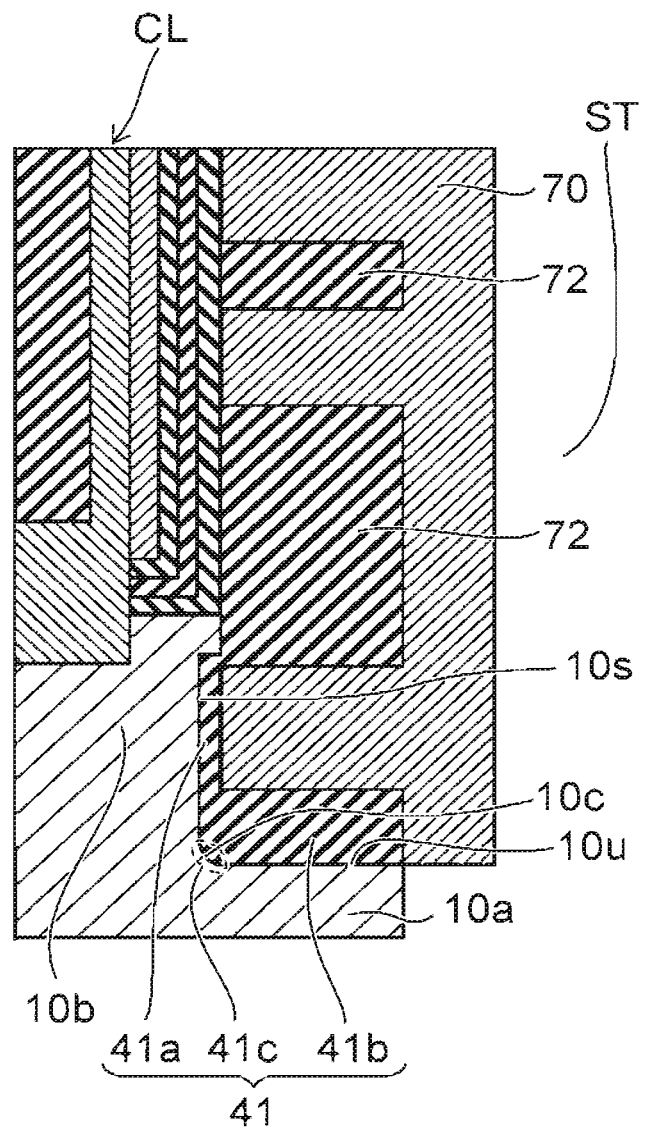
Figure 31:
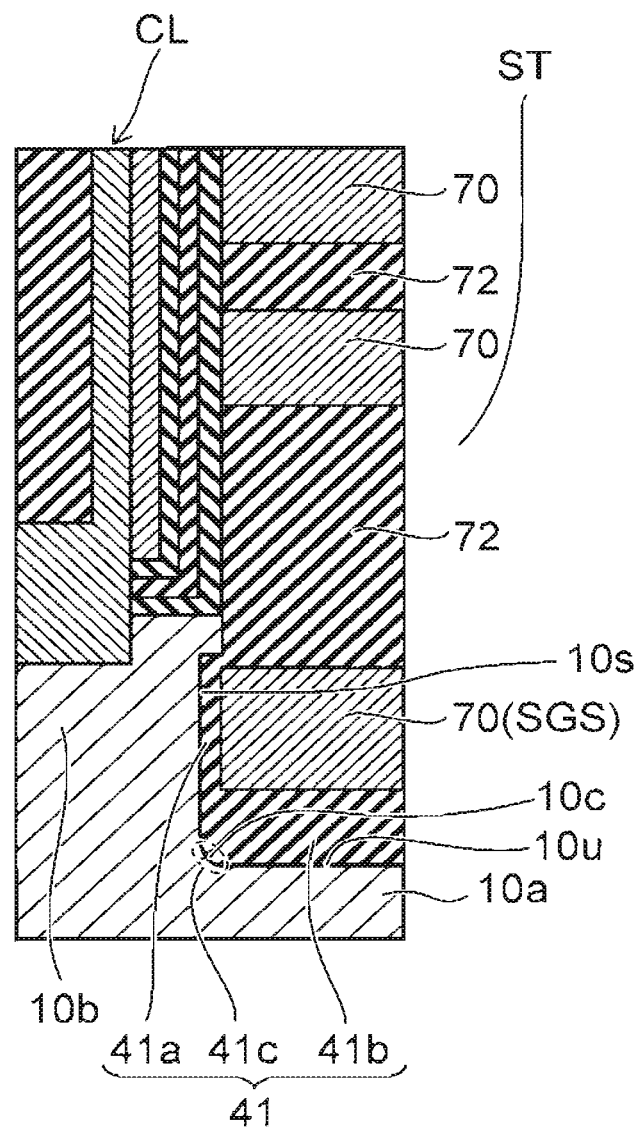

Subsequently, as shown in FIG. 30, the electrode layer 70 is formed in the gap 44. The film of the material of the electrode layer 70 formed at the side surface of the slit ST is removed as shown in FIG. 31; and the physical connection in the vertical direction between the electrode layers 70 is broken.

Subsequently, the interconnect portion LI is filled, with the insulating film 63 interposed, inside the slit ST.

In the method for manufacturing the semiconductor device of the embodiment described above, the insulating layer 72 may be removed by etching through the slits ST after the electrode layers 70 are formed in the gap 44. An air gap can be made between the electrode layers 70 adjacent to each other above and below; and the interconnect capacitance can be reduced. The columnar portions CL are used as a support of the stacked body 100; and the air gap between the electrode layers 70 is maintained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor device, comprising:
 a substrate including a first portion and a second portion, the first portion having a columnar configuration, the second portion having an upper surface continuous with a side surface of the first portion via a corner;
 a stacked body provided above the substrate, the stacked body including a plurality of electrode layers stacked with an insulator interposed, the electrode layers including a lowermost electrode layer opposing the side surface of the first portion above the second portion of the substrate;
 an insulating film provided between the side surface of the first portion of the substrate and a side surface of the lowermost electrode layer, and between the upper surface of the second portion of the substrate and a lower surface of the lowermost electrode layer;
 a semiconductor body extending in a stacking direction through the stacked body and contacting the first portion of the substrate; and
 a charge storage portion provided between the semiconductor body and the electrode layers upper than the lowermost electrode layer,
 an angle formed between the upper surface of the second portion of the substrate and the corner of the substrate on the insulating film side being greater than 90°.

2. The semiconductor device according to claim 1, wherein the corner of the substrate is curved.

3. The semiconductor device according to claim 2, wherein the insulating film includes a corner portion being rounded along the corner of the substrate.

4. The semiconductor device according to claim 1, wherein the corner of the substrate is tilted with respect to the side surface of the first portion and the upper surface of the second portion.

5. The semiconductor device according to claim 4, wherein the insulating film includes a corner portion tilted along the corner of the substrate.

6. The semiconductor device according to claim 1, wherein a curvature of the corner of the substrate is smaller than a curvature of a corner between the lower surface and the side surface of the lowermost electrode layer.

7. The semiconductor device according to claim 1, wherein the insulating film contains silicon oxide.

8. The semiconductor device according to claim 1, wherein the first portion and the second portion are a p-type silicon region.

9. The semiconductor device according to claim 8, wherein a p-type impurity concentration of the first portion and the second portion is higher than $1\times10^{15}$ cm$^{-3}$.

10. The semiconductor device according to claim 1, wherein a distance between the lowermost electrode layer and a second lowermost electrode layer is greater than a distance between other electrode layers.

11. The semiconductor device according to claim 1, further comprising an interconnect portion extending in the stacking direction and contacting the second portion of the substrate.

12. The semiconductor device according to claim 1, wherein a thickness of the insulating film provided between the upper surface of the second portion of the substrate and the lower surface of the lowermost electrode layer is thicker than a thickness of the insulating film provided between the side surface of the first portion of the substrate and the side surface of the lowermost electrode layer.

13. The semiconductor device according to claim 1, wherein a first extension line downward from the side surface of the lowermost electrode layer intersects the corner of the substrate.

14. The semiconductor device according to claim 13, wherein a thickness of the insulating film along the first extension line is thinner than a thickness of the insulating film provided between the upper surface of the second portion of the substrate and the lower surface of the lowermost electrode layer.

15. The semiconductor device according to claim 1, wherein the corner of the substrate is positioned on a side more proximal to the lowermost electrode layer than to a second extension line downward from the side surface of the first portion of the substrate.

* * * * *